US011286941B2

(12) United States Patent
Svarre et al.

(10) Patent No.: US 11,286,941 B2
(45) Date of Patent: Mar. 29, 2022

(54) PUMP ASSEMBLY

(71) Applicant: GRUNDFOS HOLDING A/S, Bjerringbro (DK)

(72) Inventors: Erik Bundesen Svarre, Bjerringbro (DK); Jan Plougmann, Risskov (DK); Therkel Damm, Silkeborg (DK); Jan Carøe Aarestrup, Bjerringbro (DK); Klaus Vestergaard Kragelund, Risskov (DK); Morten Liengaard Svarre, Bjerringbro (DK)

(73) Assignee: GRUNDFOS HOLDING A/S, Bjerringbro (DK)

( * ) Notice: Subject to any disclaimer, the term of this patent is extended or adjusted under 35 U.S.C. 154(b) by 167 days.

(21) Appl. No.: 16/711,865

(22) Filed: Dec. 12, 2019

(65) Prior Publication Data

US 2020/0191166 A1 Jun. 18, 2020

(30) Foreign Application Priority Data

Dec. 13, 2018 (EP) ..................................... 18212317

(51) Int. Cl.
*F04D 13/06* (2006.01)
*F04D 29/043* (2006.01)
(Continued)

(52) U.S. Cl.
CPC ....... *F04D 13/0686* (2013.01); *F04D 13/064* (2013.01); *F04D 13/0606* (2013.01);
(Continued)

(58) Field of Classification Search
CPC .. F04D 13/064; F04D 29/628; F04D 13/0686; F04D 13/0626; F04D 29/426;
(Continued)

(56) References Cited

U.S. PATENT DOCUMENTS 6,028,386 A * 2/2000 Kech ........................ H02K 3/47
310/194
6,065,946 A * 5/2000 Lathrop ............... F04D 13/0686
417/423.14

(Continued)

FOREIGN PATENT DOCUMENTS

CN 103140685 A 6/2013
CN 108691782 A 10/2018
(Continued)

*Primary Examiner* — Peter J Bertheaud
(74) *Attorney, Agent, or Firm* — McGlew and Tuttle, P.C.

(57) ABSTRACT

A pump assembly (1) includes a rotor axle (45) extending along a rotor axis (R), an impeller (12) fixed to the rotor axle (45), a pump housing (11) accommodating the impeller (12), and a drive motor with a stator (17) and a rotor (51). The rotor (51) is fixed to the rotor axle (45) for driving the impeller (12). A rotor can (57) accommodates the rotor (51). The rotor can (57) includes a rotor can flange (63). An electronics housing (13) has a cap (21) including a first material (139) forming a front face (19) of the cap (21). The front face (19) extends essentially perpendicular to the rotor axis (R). The first material (139) is at least partially overmolded with a second material (141) at an inner side of the cap (21). The second material (141) is more heat-conductive than the first material (139).

20 Claims, 19 Drawing Sheets

(51) Int. Cl.
  *F04D 29/046* (2006.01)
  *F04D 29/42* (2006.01)
  *F04D 29/58* (2006.01)
  *F04D 29/62* (2006.01)
  *H05K 5/02* (2006.01)
  *H05K 5/03* (2006.01)
  *H05K 7/20* (2006.01)

(52) U.S. Cl.
  CPC ...... *F04D 13/0626* (2013.01); *F04D 13/0693* (2013.01); *F04D 29/043* (2013.01); *F04D 29/046* (2013.01); *F04D 29/426* (2013.01); *F04D 29/5806* (2013.01); *F04D 29/5813* (2013.01); *F04D 29/5893* (2013.01); *F04D 29/628* (2013.01); *H05K 5/0239* (2013.01); *H05K 5/03* (2013.01); *H05K 7/2039* (2013.01)

(58) Field of Classification Search
  CPC ............. F04D 13/0606; F04D 29/5813; F04D 29/5806; F04D 13/0693; F04D 29/5893; H02K 11/33; H02K 5/225; H02K 2211/03; H05K 5/0239; H05K 5/03; H05K 7/2039
  See application file for complete search history.

(56) References Cited

U.S. PATENT DOCUMENTS

| | | | |
|---|---|---|---|
| 6,445,098 | B1 * | 9/2002 | Materne .............. F04D 13/0626 310/418 |
| 9,467,019 | B2 * | 10/2016 | Kannegaard Andersen ................ F04D 13/0606 |
| 9,546,663 | B2 * | 1/2017 | Hoj ......................... H02K 7/14 |
| 9,721,306 | B2 * | 8/2017 | Sakata .................. G06F 16/275 |
| 10,027,199 | B2 * | 7/2018 | Schuldt .................... H02K 5/22 |
| 2015/0354575 | A1 * | 12/2015 | Olsen ...................... H02K 9/22 310/64 |
| 2017/0082117 | A1 * | 3/2017 | Zhou .................. F04D 29/5813 |
| 2018/0283382 | A1 * | 10/2018 | Vestergaard Kragelund ............... F04D 29/628 |

FOREIGN PATENT DOCUMENTS

| | | |
|---|---|---|
| EP | 2072828 A1 | 6/2009 |
| EP | 2618004 A1 | 7/2013 |
| EP | 3339656 A1 | 6/2018 |
| JP | 5349005 B2 | 11/2013 |

* cited by examiner

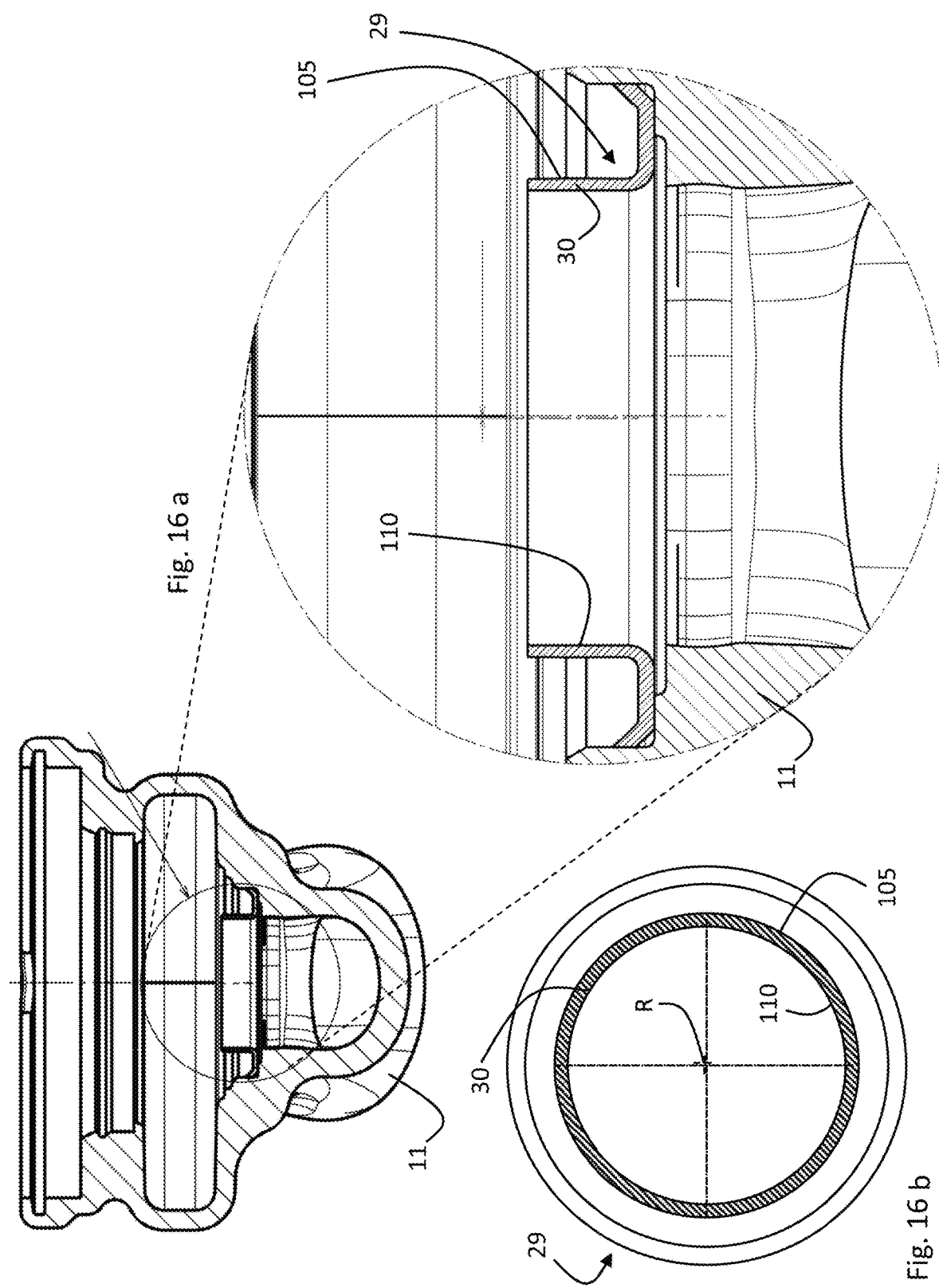

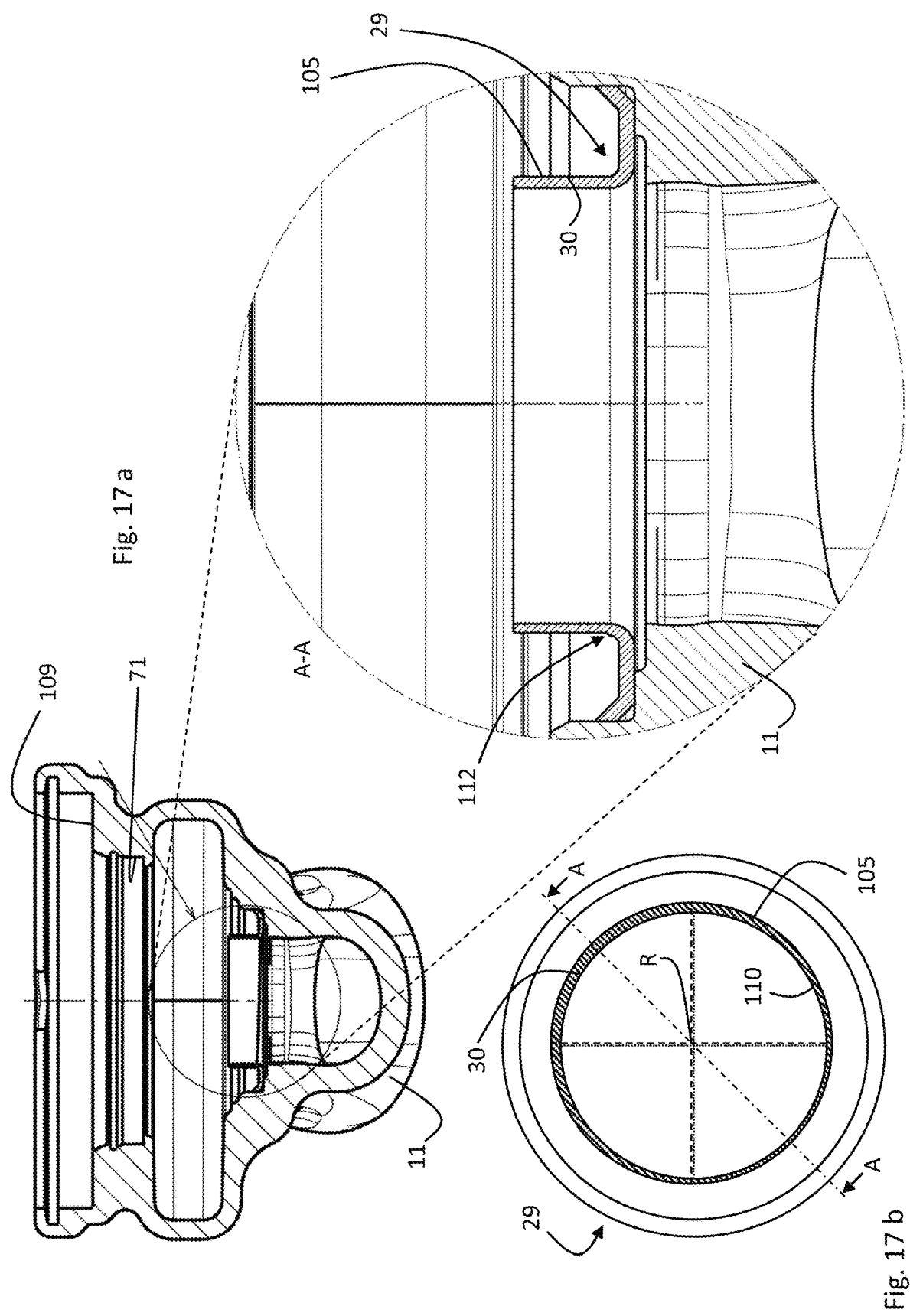

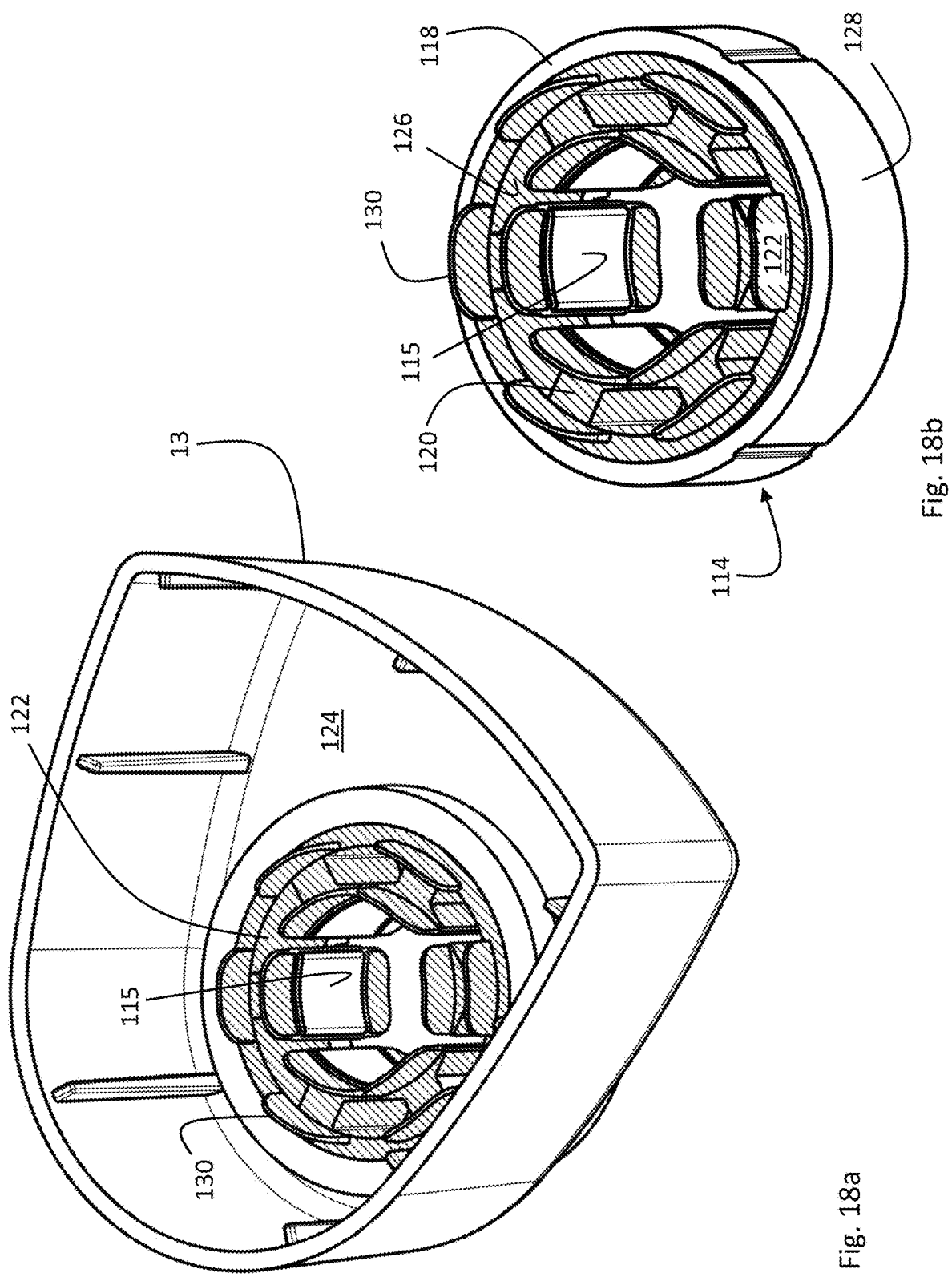

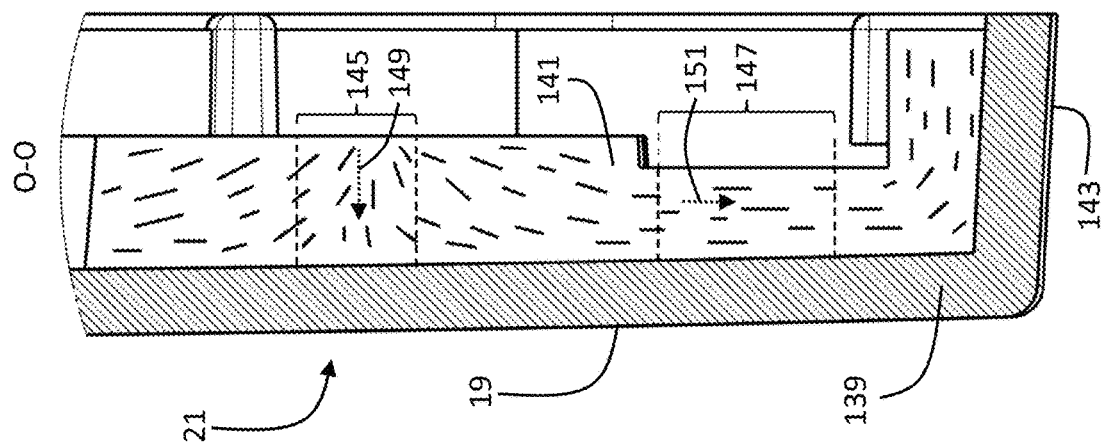
Fig. 19c
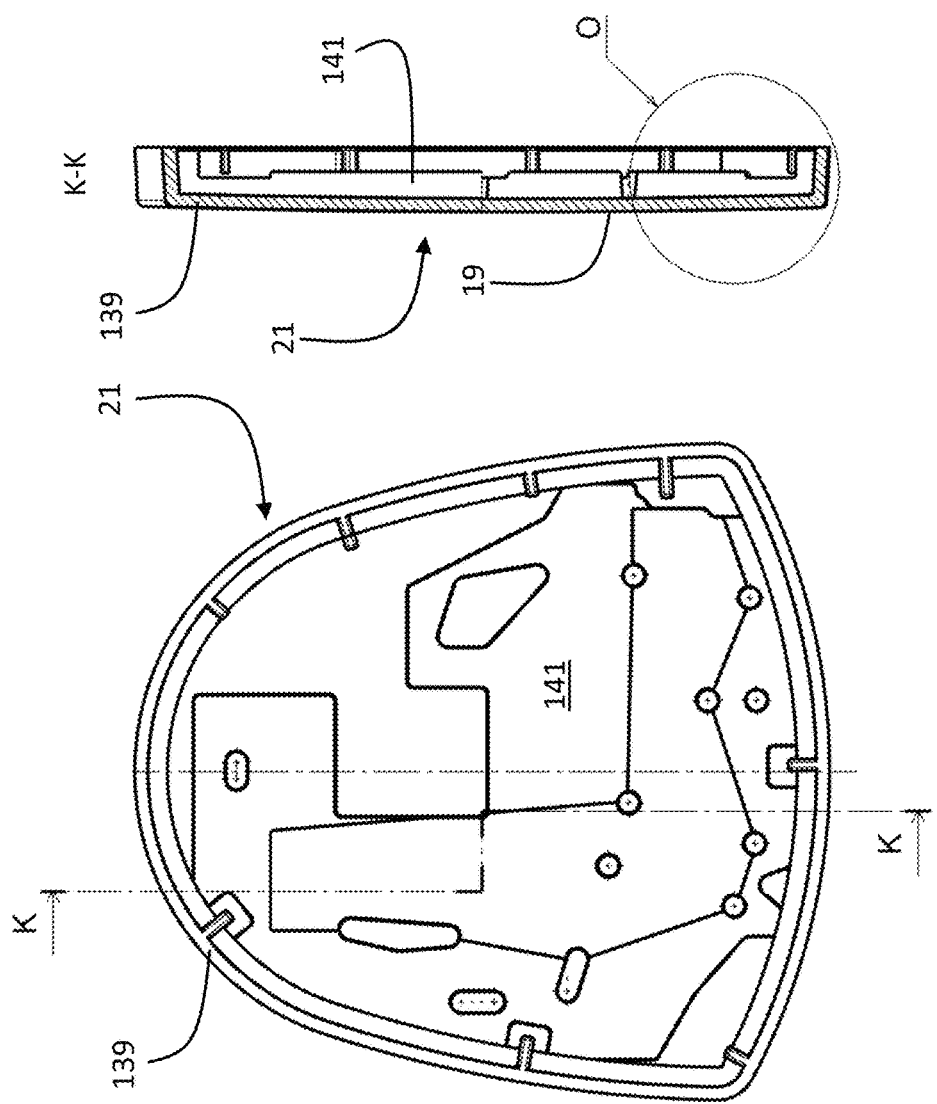
Fig. 19b
Fig. 19a

PUMP ASSEMBLY

CROSS REFERENCE TO RELATED APPLICATIONS

This application claims the benefit of priority under 35 U.S.C. § 119 of European Application 18 212 317.4, filed Dec. 13, 2018, the entire contents of which are incorporated herein by reference.

TECHNICAL FIELD

The present disclosure relates generally to pump assemblies, in particular to speed controlled wet rotor pumps. Such pumps in the power range of 5 W to 3 kW are typically used as circulation pumps of house heating systems.

TECHNICAL BACKGROUND

Wet rotor pumps usually comprise a rotor can separating a permanent magnet rotor from a stator. The rotor drives an impeller located in a pump housing. Typically, a motor housing is fastened to the pump housing, wherein the rotor can and the stator are attached to the pump housing by the fastener of the motor housing.

EP 2 072 828 A1 describes a wet rotor centrifugal pump as a circulation pump for heating systems in buildings. The pump disclosed therein has a compact design by locating motor electronics at least partially radially around the stator. The motor housing of that pump is attached to the pump housing via a rotor can flange so that the motor housing can be removed without releasing any wet parts. However, the pump disclosed therein uses circumferentially distributed trunnions 26 of a large rotor can flange for rotation prevention and axial alignment of the components. The large rotor can require significant lateral space.

For an even more compact design other solutions are needed.

SUMMARY

In contrast to such known pumps, embodiments of the present disclosure provide a pump assembly with a more compact design.

In accordance with a first aspect of the present disclosure, a pump assembly is provided comprising
- a rotor axle extending along a rotor axis,
- an impeller fixed to the rotor axle,
- a pump housing accommodating the impeller, wherein the pump housing defines a first radial inner reference surface,
- a drive motor comprising a stator and a rotor, wherein the rotor is fixed to the rotor axle for driving the impeller,
- a rotor can accommodating the rotor, wherein the rotor can comprises a rotor can flange, and
- an electronics housing accommodating the stator.

The electronics housing comprises a cap comprising a first material forming a front face of the cap, wherein the first material of the cap is at least partially overloaded with a second material at an inner side of the cap, wherein the second material is more heat-conductive than the first material.

Such a cap having an overmolded inner side allows for a better dissipation of heat from the electronic components on a printed circuit board (PCB) within a compact electronics housing.

Optionally, the cap may comprise a radially outer wall comprising the first material and extending essentially perpendicular to the front face, wherein an inner side of the radially outer wall is at least partially overmolded with the second material. Thereby, an ambient vertical convection air stream may effectively pass the cap to cool it down, irrespective of whether the pump is installed vertically or horizontally. The overmolded inner side of the radially outer wall is particularly effective when the pump is installed in a vertical arrangement with a vertical rotor axis.

Optionally, the first material may have a higher dielectric strength and/or a higher comparative tracking index (CTI) than the second material. As good heat-conductive properties often come with bad electrically insulating properties, the outer first material primarily fulfils safety requirements in view of electric insulation and low flammability, such as a polyamide (PA), a polyphenylene sulphide (PPS), or a polyether ether ketone (PEEK). The first material may be classified with the highest flame-retarding rating 5VA according to the UL 94 Standard for Safety of Flammability of Plastic Materials. The first material may comprise a certain glass fibre content, for instance 10% to 50%, preferably about 30%, depending on the requirements. The second material may be a moldable plastic that contains heat-conductive additives such as graphite carbon fibers and/or ceramics like boron nitride. Those heat-conductive additives may decrease the dielectric strength and/or the comparative tracking index (CTI), though.

Optionally, the second material may be terraced at an inner side facing towards a PCB extending essentially parallel to the front face in order to establish an axial direct or indirect thermal contact between the second material and electronic components on the PCB. The axial direct or indirect thermal contact may be supported by a heat-conductive paste arranged between the second material and the electronic components on the PCB.

Optionally, the second material may comprise at least one first area having a first direction of predominant heat-conduction extending essentially perpendicular to the front face, and wherein the second material comprises at least one second area having a second direction of predominant heat-conduction extending essentially parallel to the front face. This is beneficial for a better heat dissipation into the second material at the first area(s) where the hottest electronic components may be located, and beneficial for a lateral heat distribution via the second area(s) over the full area of the front face and/or the radially outer wall.

Optionally, the at least one first area may be located at or around injection points for overmolding the first material of the cap with the second material. It was found that the direction of best heat-conduction follows the flow direction of the second material during the overmolding of the inner side of the cap. Therefore, the overmolding injection point(s) may define the first area(s).

Optionally, the at least one first area may be axially in direct or indirect thermal contact with the one of those electronic components on the PCB that dissipate most heat during pump operation. Thereby, the heat of the hottest electric components on the PCB is effectively dissipated into the second material at the first area(s) and then distributed laterally away via the second area(s).

Optionally, the pump assembly may further comprise
- a first radial bearing ring being in sliding contact with the rotor axle, and a bearing retainer embracing (engaging) the first radial bearing ring and centering the first radial bearing ring with respect to the first radial inner reference surface of the pump housing, wherein the rotor can flange has a radial distance to the pump housing and the rotor can comprises a radial inner centering surface being centered by radially abutting against a radial outer centering surface of the bearing retainer.

Thus, the rotor can may not be centered by the pump housing directly. Instead, the rotor can flange may have a radial distance to the pump housing and thus some lateral wiggle room for coaxial alignment of the rotor can with respect to the pump housing by means of the bearing retainer. The bearing retainer embracing the first radial bearing ring being in sliding contact with the rotor axle defines the centric position of the rotor axis with respect to the pump housing. The exact centric alignment of the rotor axis with respect to the pump housing is important to minimize a gap between the impeller and a neck ring of the pump housing, wherein the neck ring separates a low-pressure chamber (fluid input) of the pump housing from a high-pressure chamber (fluid output) of the pump housing. The gap between the impeller and the neck ring must be large enough for low-friction rotation of the impeller, wherein the gap must account for any eccentricity of the rotor axis with respect to the neck ring of the pump housing due to manufacturing tolerances. However, the larger the gap between the impeller and the neck ring is, the more fluid escapes from the high-pressure chamber directly back through the gap to the low-pressure chamber, which costs pumping efficiency.

Preferably, the pump assembly disclosed herein may provide a smaller gap and thus a higher pump efficiency, because manufacturing tolerances between the rotor can and the bearing retainer, which are typically independently manufactured in separate manufacturing steps, do not lead to an eccentricity of the rotor axis with respect to the neck ring of the pump housing. A radial inner centering surface of the rotor can may be centered by radially abutting against a radial outer centering surface of the bearing retainer defining the central position of the rotor axis with respect to the pump housing.

Optionally, the radial inner centering surface of the rotor can and/or the radial outer centering surface of the bearing retainer may have at least three, preferably four, radial projections. The radial projections facilitate an exact concentric alignment between the rotor can and the bearing retainer.

Optionally, the bearing retainer may comprise a radial outer bearing retainer surface having at least three radial projections radially abutting against the first radial inner reference surface of the pump housing and centering the bearing retainer with respect to the first radial inner reference surface of the pump housing. These radial projections facilitate an exact concentric alignment of the bearing retainer with respect to the pump housing. The first radial inner reference surface of the pump housing may be defined in the same manufacturing step of the pump housing when the neck ring position is defined to minimize manufacturing tolerances.

Optionally, the rotor can flange may form a circumferential U-shaped groove with a radial inner section and a radial outer section, wherein the radial inner section forms the radial inner centering surface of the rotor can. Thereby, the rotor can flange is stiffened and stabilized. It should be noted that the rotor can may not even be in direct contact with the pump housing.

Optionally, the rotor can flange may comprise a annular stop surface facing away from the impeller. This stop surface may define an exact positioning of the rotor can in axial direction. In contrast to wet rotor centrifugal pumps known in the prior art, the rotor can is axially not limited by the pump housing directly. The rotor can may thus be more resilient to withstand pressure shocks. The annular stop surface may be conical, wherein the radially outward end of the annular stop surface is located further away from the impeller than the radially inward end of the annular stop surface. The rotor can flange may thus deform resiliently for an axial movement to resiliently withstand pressure shocks.

Optionally, a locking ring may be secured in a circumferential groove of the pump housing, wherein the annular stop surface axially abuts against the locking ring. When the pump assembly is assembled, the locking ring may be placed into the groove after the rotor can flange has been placed into position within the pump housing. If the end of the rotor axle to which the impeller is fixed is denoted as the "lower" end and the rotor axle extends "upward" from the impeller into the rotor can, the rotor can is secured against an "upward" movement. This is fundamentally different to the pumps known in the prior art, wherein the rotor can is fixed "downwardly" to the pump housing by screws. Thus, the pump assembly disclosed herein allows for a much more compact configuration.

Optionally, the rotor can flange may comprise an annular contact surface facing towards the impeller and the bearing retainer flange comprises an annular biasing surface facing away from the impeller, wherein the bearing retainer is resiliently preloaded for biasing the annular biasing surface of the bearing retainer flange against the annular contact surface of the rotor can flange. The bearing retainer may thus not only be used for centering the rotor can, but also for axial positioning of the rotor can with respect to the pump housing. The bearing retainer may comprise a conical bearing retainer flange section, wherein the radially outward end of the bearing retainer flange section is located closer to the impeller than the radially inward end of the bearing retainer flange section. The radially outward end of the bearing retainer flange section may rest on an axial stop surface of the pump housing. The annular biasing surface may be formed by a radially inward portion of the conical bearing retainer flange section. The annular contact surface of the rotor can flange and/or the annular biasing surface of the bearing retainer flange may comprise at least three axial projections.

During assembly of the pump assembly, the bearing retainer may be placed into the pump housing to rest of the axial stop surface of the pump housing. The rotor can may be pressed downwards with its lower annular contact surface onto the upper annular biasing surface of the bearing retainer to resiliently deform the conical bearing retainer flange section. The locking ring is placed into the groove to secure the rotor can axially while the rotor can is pressed down against the bearing retainer. Thus, the bearing retainer is resiliently preloaded to bias the rotor can upward against the locking ring. The impeller, the rotor axle, the rotor, the bearings, the bearing retainer and the rotor can may be placed into the pump housing as a pre-assembled unit being secured downwards by the locking ring, wherein the bearing retainer acts as an upwardly biasing spring.

Optionally, a neck ring may be fixed to the pump housing, wherein the impeller is located axially between the bearing retainer and the neck ring, wherein the neck ring comprises a cylindrical section at least partially extending into the impeller. Alternatively, the impeller may at least partially extend into the cylindrical section of the neck ring. Optionally, the cylindrical section may comprise a radial outer or inner gap surface and the impeller may comprise a radial inner or outer gap surface, wherein the radial outer or inner gap surface of the cylindrical section and the radial inner or outer gap surface of the impeller have a radial distance defining a gap. Such a radial gap distance can be minimized by the pump assembly described herein, which provides for a better pumping efficiency.

Optionally, the pump housing may define a first annular reference surface facing away from the impeller and the stator housing defines a second annular reference surface facing towards the impeller, wherein the second annular reference surface is biased against the first annular reference surface. Preferably, the first annular reference surface of the pump housing is defined in the same machining step as the first radial inner reference surface, preferably with the same drilling head, to minimize manufacturing tolerances. The first annular reference surface may thus extend in a plane exactly orthogonal to the center axis of the first radial inner reference surface. Therefore, the first annular reference surface may allow for an exact angular alignment of the stator housing with respect to the pump housing.

Optionally, the stator may define a second radial inner reference surface and the rotor can may comprise a radial outer alignment surface being aligned perpendicular to the first annular reference surface of the pump housing by radially abutting against the second radial inner reference surface of the stator. Thereby, the rotor can may be angularly aligned with respect to the pump housing by means of the stator housing. For instance, the stator may comprise a plurality of stator teeth around each of which a stator coil in form of windings is spooled, wherein the second radial inner reference surface is defined by the radial inner surface of the plurality of stator teeth.

Optionally, the first annular reference surface may be located radially more outward than the first radial inner reference surface and/or the first annular reference surface is located axially further away from the impeller than the first radial inner reference surface. Thereby, the pump housing provides a good leverage for the stator housing to angularly align the rotor can with respect to the pump housing.

Optionally, the second radial inner reference surface is located radially more inward than the second annular reference surface and/or the second radial inner reference surface is located axially further away from the impeller than the second annular reference surface. Thereby, the stator housing has a good leverage to angularly align the rotor can with respect to the pump housing.

Optionally, the second annular reference surface may extend in a plane essentially orthogonal to the center axis of the second radial inner reference surface. Therefore, the second annular reference surface may allow for an exact angular alignment of the rotor can with respect to the pump housing.

Optionally, the pump assembly may comprise a bayonet ring for securing the stator housing to the pump housing, wherein the bayonet ring is resiliently preloaded for axially biasing the stator housing against the pump housing towards the impeller. The second annular reference surface of the stator housing is thus pressed downwards onto the first annular reference surface of the pump housing by means of the bayonet ring. The bayonet ring allows for securing the stator housing to the pump housing in a very compact way.

Furthermore, the bayonet ring secures the stator housing against rotation around the rotor axis in well-defined angular position. The bayonet ring may be a metal wire with circular cross-section. The bayonet ring may comprise circumferential first sections with a first radius and circumferential second sections with a second radius, wherein the second radius is smaller than the first radius. The second sections may be formed as radially inward projections cooperating with bayonet grooves in a radially outer surface of the stator housing. The first sections of the bayonet ring may be secured in a circumferential groove of the pump housing. The bayonet grooves in the stator housing may comprise a first "vertical" section through which the second sections of the bayonet ring pass when the stator housing is placed downwards onto the first annular reference surface of the pump housing. The bayonet grooves in the stator housing may comprise a second "upwardly sloped" circumferential section with a first end at the first "vertical" section and a second end circumferentially distanced from the first end, wherein the first end of the second section is located closer to the second annular reference surface of the stator housing than the second end of the second section. Upon manual rotation of the stator housing by a pre-defined angle for the second sections of the bayonet ring to be guided along the second sections of the bayonet grooves from the first end to the second end, the second sections of the bayonet ring are pushed upward by the slope while the first sections of the bayonet ring remain secured in the pump housing. Thereby, the bayonet ring resiliently twists between the first sections and the second sections. The second sections of the bayonet ring may click into a horizontal or "downwardly sloped" end section at the second end of the second section of the grooves. The resilient twist of the bayonet ring biases the second annular reference surface of the stator housing downward onto the first annular reference surface of the pump housing.

In accordance with a second aspect of the present disclosure, a method of manufacturing a cap of an electronics housing of a pump assembly is provided, the method comprising the steps:

forming a front face of the cap from a first material, and
at least partially overmolding the first material with a second material at an inner side of the cap wherein the second material is more heat-conductive than the first material.

Optionally, the second step of at least partially overmolding comprises injecting the second material at one or more areas where those electronic components on a PCB extending essentially parallel to the front face are located which dissipate most heat during pump operation.

Optionally, the first material has a higher dielectric strength and/or a higher comparative tracking index (CTI) than the second material.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 16a is a cut view with a detailed cut view of a pump housing with an installed neck ring before being machined according to an example of a pump assembly disclosed herein;

FIG. 16b is a top view of a neck ring before being machined according to an example of a pump assembly disclosed herein;

FIG. 17a is a cut view and a detailed cut view of a pump housing with an installed neck ring after being machined according to an example of a pump assembly disclosed herein;

FIG. 17b is a top view of a neck ring after being asymmetrically machined according to an example of a pump assembly disclosed herein;

FIG. 18a is a perspective view of a stator housing and a stator former as part of the stator housing according to an example of a pump assembly disclosed herein;

FIG. 18b is a perspective view of a stator housing and a stator former as part of the stator housing according to an example of a pump assembly disclosed herein;

FIG. 19a is a bottom view of a cap of a stator housing according to an example of a pump assembly disclosed herein;

FIG. 19b is a sectional view along cut K-K of the cap as outlined in FIG. 19a; and FIG. 19c is a detailed view O-O, as outlined in FIG. 19b, of the cap.

DESCRIPTION OF PREFERRED EMBODIMENTS

Figure 8A:
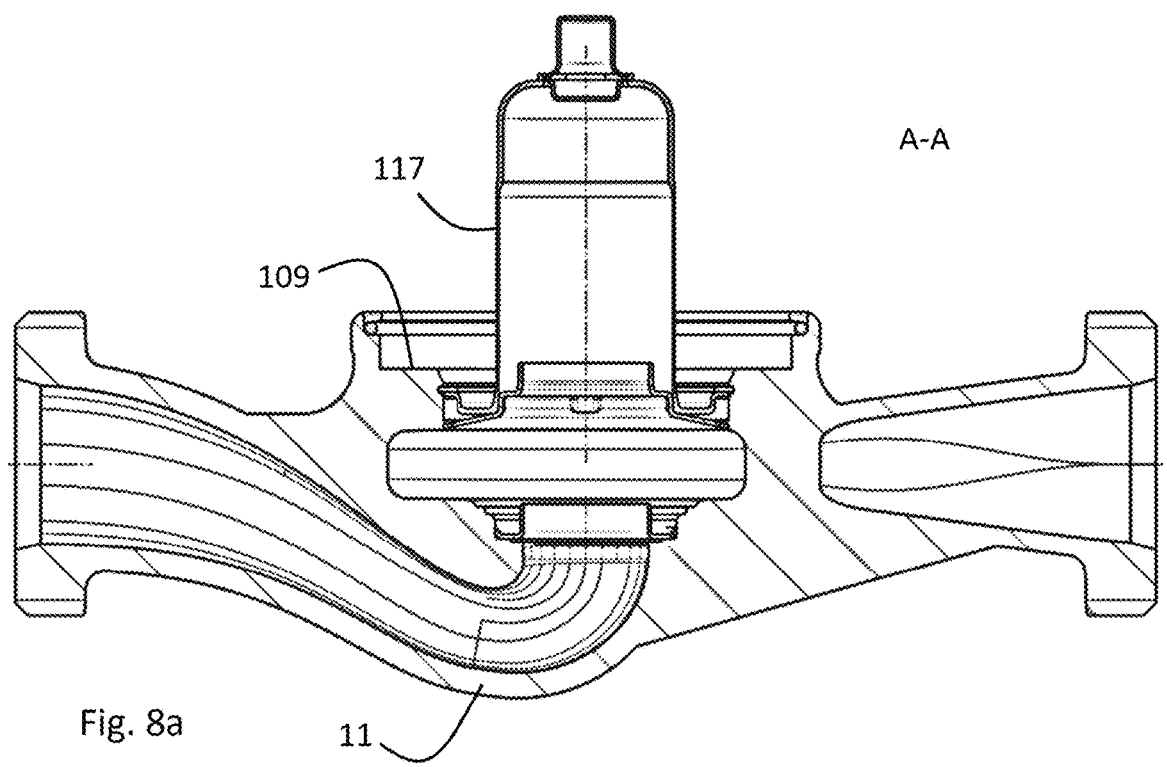
FIG. 8a is a longitudinal cut view along cut A-A as outlined in FIG. 7 of an example of a pump assembly disclosed herein.
Figure 8B:
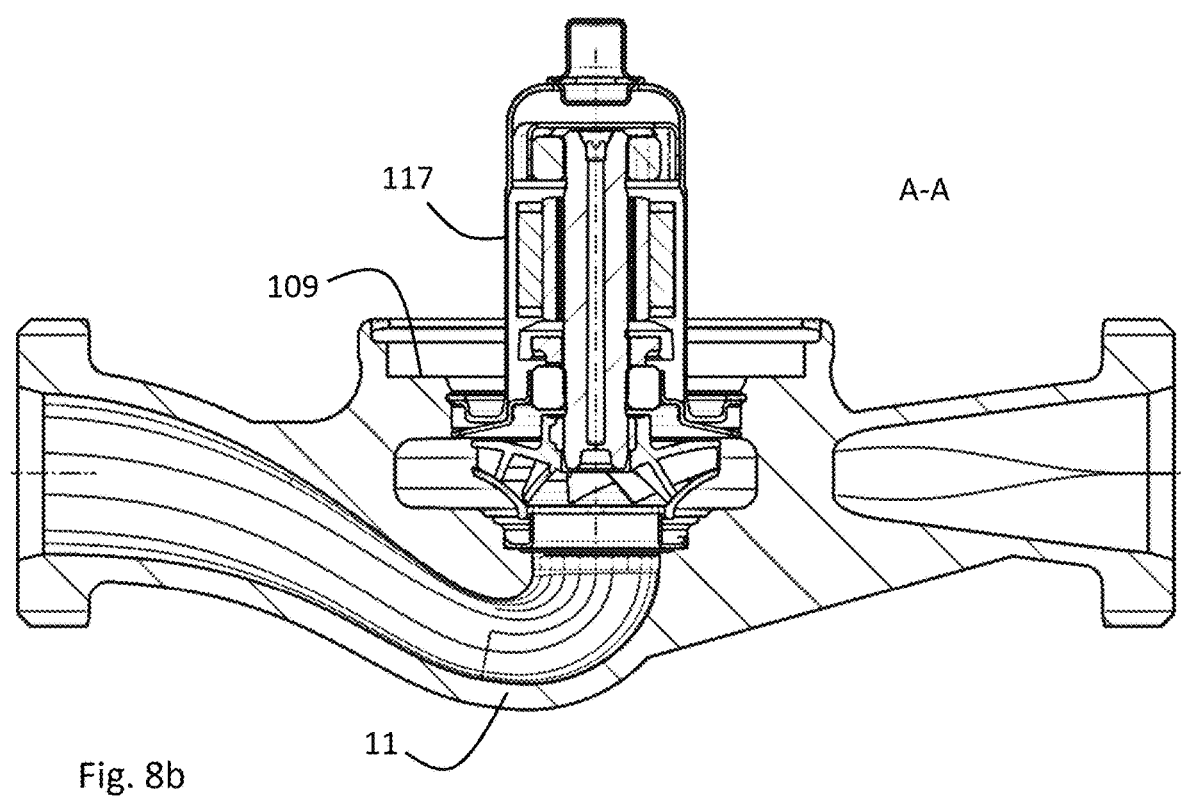
FIG. 8b is a longitudinal cut view along cut A-A as outlined in FIG. 7 of an example of a pump assembly disclosed herein.
Figure 9:
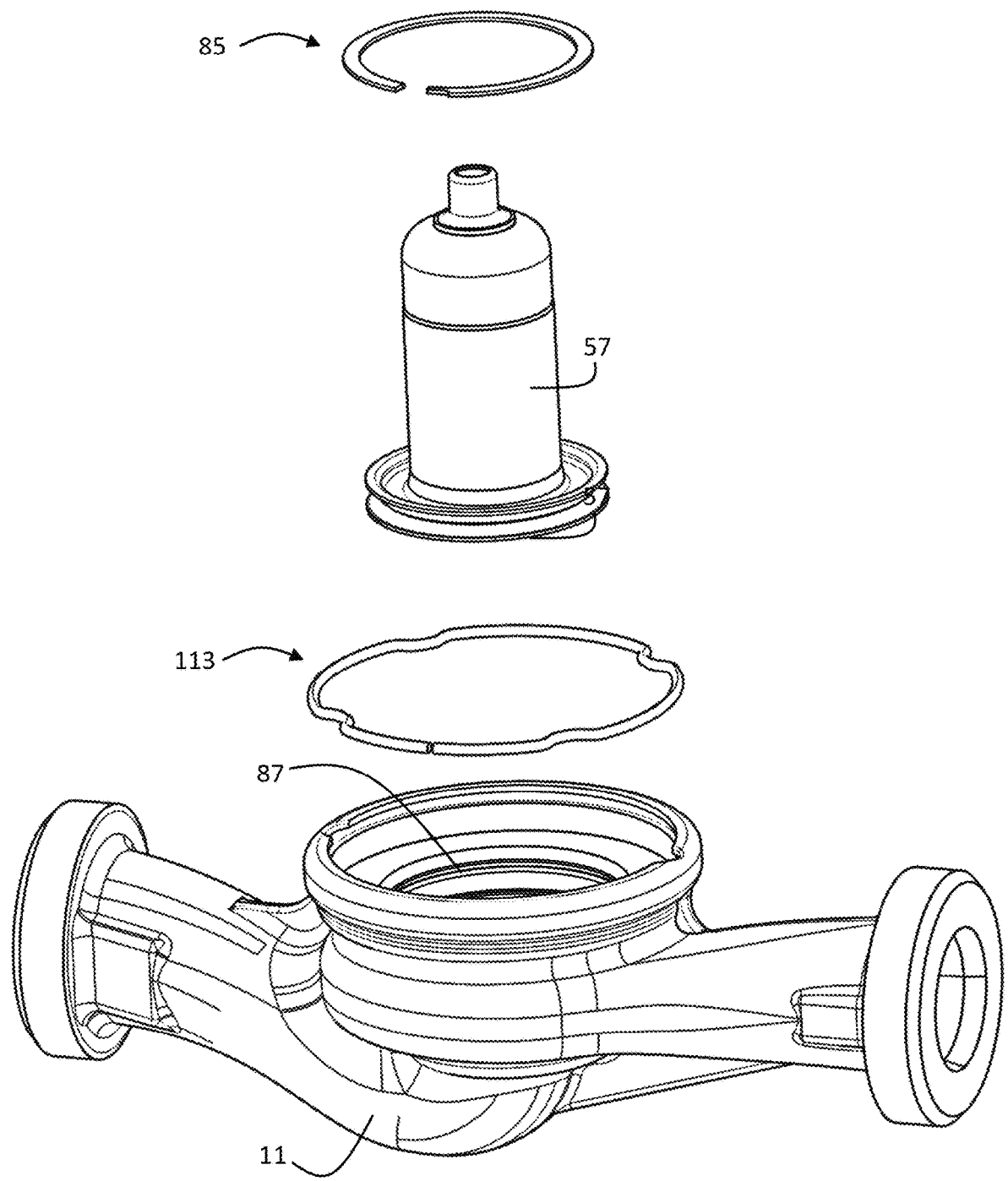
FIG. 9 is a partly exploded view of a pump housing plus a bayonet ring, a rotor can and a locking ring according to an example of a pump assembly disclosed herein.
Figure 10:
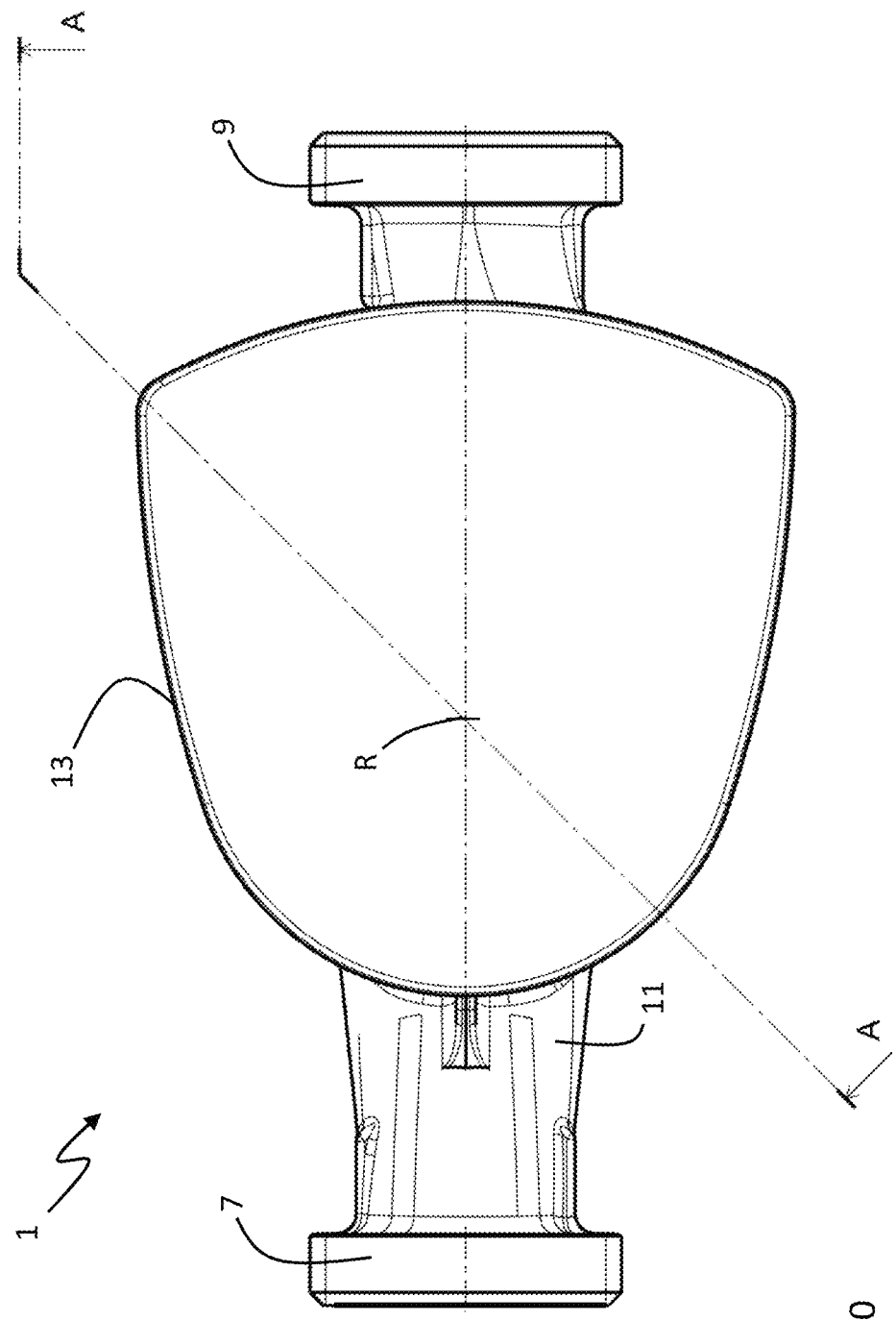
FIG. 10 is a top view of an example of a pump assembly disclosed herein.

Referring to the drawings, FIGS. 1 to 19 show embodiments of a pump assembly 1 with a centrifugal pump unit 2, an input port 3 and an output port 5, wherein the input port 3 and the output port 5 are coaxially arranged on a pipe axis F on opposing sides of the pump unit 2. The input port 3 and the output port 5 comprise connector flanges 7, 9 for a connection to pipes (not shown). The pump unit 2 comprises a rotor axis R essentially perpendicular to the pipe axis F. It should be noted that the terms "radial", "circumferential", "angular" and "axial" throughout this disclosure are to be understood with reference to the rotor axis R. A pump housing 11 of the pump unit 2 is arranged between the input port 3 and the output port 5. The pump housing 11 comprises an impeller 12 (see FIGS. 3, 4 and 8a,b) for rotating counter-clockwise around the rotor axis R and pumping fluid from the input port 3 to the output port 5. The impeller 12 is driven counter-clockwise by a three-phase synchronous permanent magnet drive motor having a stator 17 located in a stator housing 13 around the rotor axis R. The electronics are also accommodated by the stator housing 13, so that the stator housing 13 may be denoted as electronics housing 13. The stator housing 13 is mounted to the pump housing 11 by means of a bayonet-like mount (see FIGS. 4 and 12).

The stator housing 13 comprises motor control electronics on a printed circuit board (PCB) 15 extending in a plane essentially perpendicular to the rotor axis R below a front face 19 of a cap 21 of the stator housing 13. The stator housing 13 is not rotationally symmetric, but provides more room at one lateral side for electronics controlling the motor (see FIG. 2). The motor and motor electronics are power supplied via a low DC voltage connector (not shown). The pump assembly 1 may comprise an external power supply module (not shown) for connection with the low DC voltage connector. The external power supply module may transform an AC line voltage of 110-240V to a low DC voltage of 30-60V. The external power supply may comprise a line filter against electromagnetic interference (EMI) and a voltage converter, which is located on the motor electronics PCB. Thus, the motor electronics PCB 15 and the stator housing 13 may have a more compact configuration. The front face 19 of the cap 21 of the stator housing 13 may comprise a user interface, such as a button, a light-emitting diode (LED) and/or a display (not shown). A button may for instance be an on/off-button. One or more LEDs and/or a display may signal an operating parameter or status, e.g. for indicating a normal operation, a failure mode, a motor speed, a successful/unsuccessful wireless connection, a power consumption, a flow, a head and/or a pressure.

Figure 1:
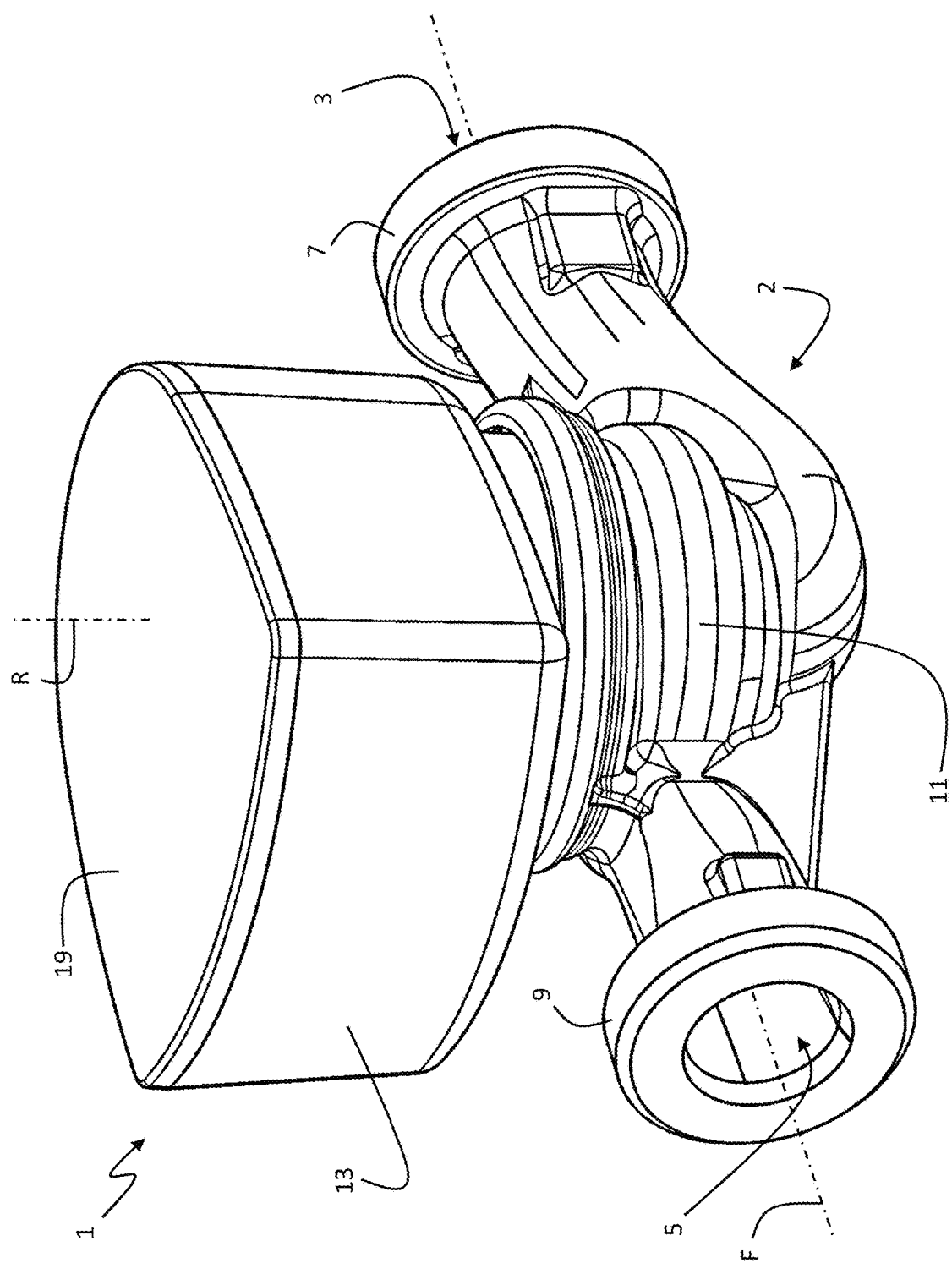
FIG. 1 is a perspective view of an example of a pump assembly disclosed herein.
Figure 2:
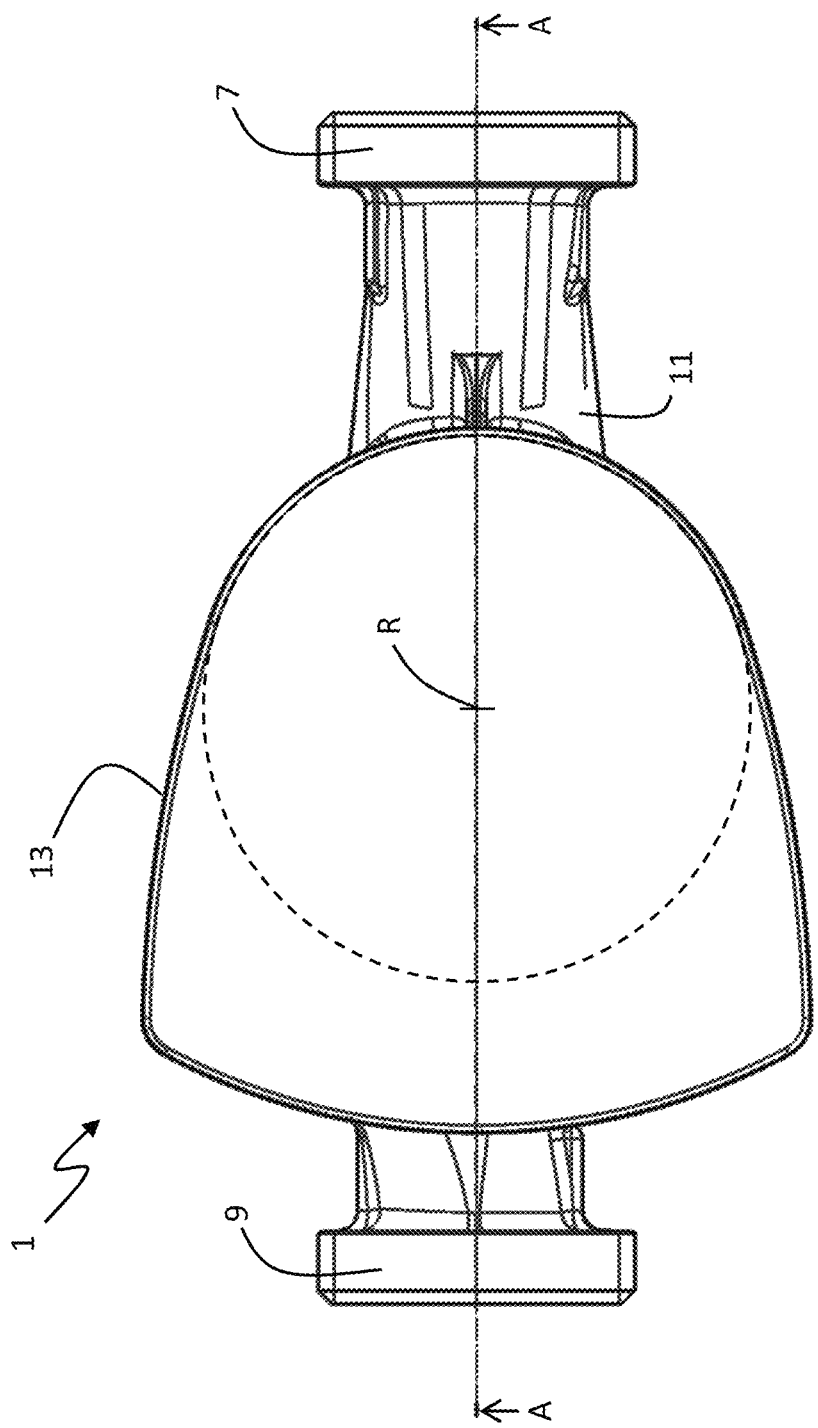
FIG. 2 is a top view of an example of a pump assembly disclosed herein.
Figure 3:
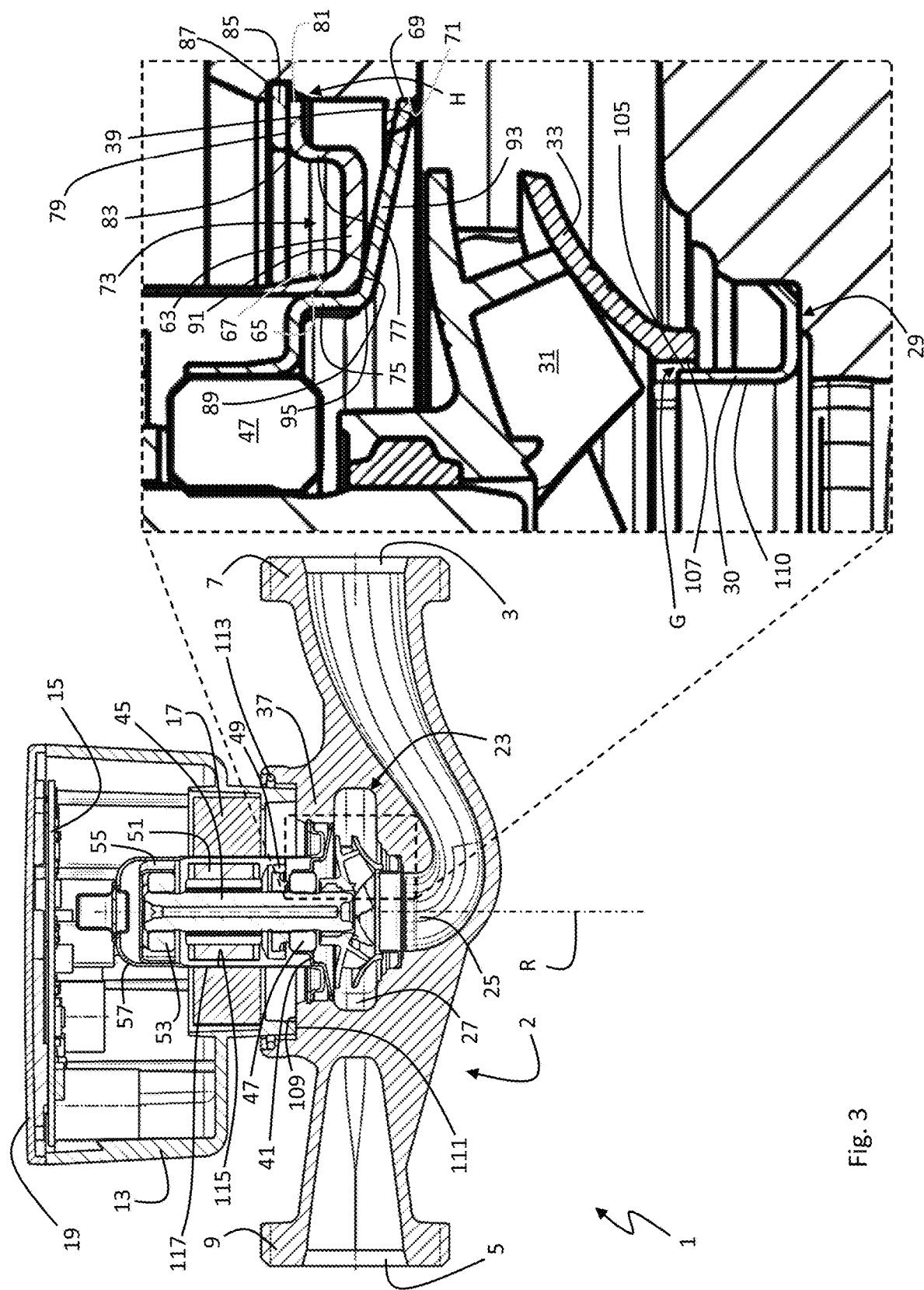
FIG. 3 is a longitudinal cut view along cut A-A as outlined in FIG. 2 of an example of a pump assembly disclosed herein.

The top view of FIG. 2 shows the cut A-A, the view of which is shown in FIG. 3. The non-rotationally-symmetric shape of the stator housing 13 is clearly visible in FIG. 2. The cut view of FIG. 3 displays the very compact pump configuration achieved by the pump assembly disclosed herein. The inlet port 3 curls from the pipe axis F in a fluid-mechanically efficient way to lead from below coaxially with the rotor axis R into an impeller chamber 23 of the pump housing 11. The impeller chamber 23 has a concentric bottom entry 25 in fluidic connection with the inlet port 3 and a tangential exit 27 in fluidic connection with the outlet port 5. A neck ring 29 fixed to the pump housing 11 comprises a circumferential wall section 30 extending partially into the impeller 12 and thereby separating the impeller chamber 23 into a low-pressure chamber including the bottom entry 25 (fluid input) from a high-pressure chamber including the tangential exit 27 (fluid output). There is a gap G between the impeller 12 and the circumferential wall section 30 of the neck ring 29 that must be large enough for low-friction rotation of the impeller 12, wherein the gap G must account for any eccentricity of the rotor axis R with respect to the neck ring 29 due to manufacturing tolerances. However, the gap G should be minimal to minimize the amount of fluid escaping from the high-pressure chamber directly back through the gap G to the low-pressure chamber, which costs pumping efficiency. The impeller 12 comprises inner spiral vanes 31 and at its bottom side an impeller plate 33 for forming fluid-mechanically efficient impeller channels for accelerating fluid radially outward and tangentially in counter-clockwise direction by a centrifugal force when the impeller 12 rotates. Such a radially outward and tangentially flow creates a central suction of fluid from the inlet port 3.

The pump housing 11 has an upper circular opening 35 through which the impeller 12 can be placed into the impeller chamber 23 during manufacturing of the pump unit 2. In order to achieve a most compact pump configuration, the circular opening 35 may have a just slightly larger diameter than the impeller 12. The end of the circular opening 35 is formed by a radially inward projection 37. The radially inward projection 37 forms an axial annular surface 39 on which a bearing retainer 41 resides with a radial outer section of a bearing retainer flange 43. A rotor axle 45 extends along the rotor axis R through the bearing retainer 41 and is rotationally fixed with a lower end portion to the impeller 12. The bearing retainer 41 centers a first radial bearing ring 47 with a radially inner ceramic surface being in radial sliding contact with an outer ceramic surface of the rotor axle 45. The rotor axle 45 and the first radial bearing ring 47 may comprise ceramic low friction radial contact surfaces. A very thin lubricating film of the pumped fluid in the range of microns may establish between the rotor axle 45 and the first radial bearing ring 47 when the rotor axle 45 rotates relative to the fixed first radial bearing ring 47. An axial bearing plate 49 is placed on top of the first radial bearing ring 47 to provide a low friction annular bottom carbon surface. There is a thin lubricating film of the pumped fluid between the low friction annular bottom carbon surface and an annular top ceramic face of the first radial bearing ring 47 for a low-friction axial sliding contact. A permanent magnet rotor 51 embraces the rotor axle 45 and is rotationally fixed to it. A second radial bearing ring 53 is in low-friction radial sliding contact with an upper end of the rotor axle 45. The second radial bearing ring 47 is centered by a bearing bushing 55 with radial extensions and axial channels for allowing an axial fluid flow. As the impeller 12 sucks itself together with the rotor axle 45 and the permanent magnet rotor 51 downwards during rotation, only one axial bearing plate 49 is necessary.

The neck ring 29, the impeller 12, the rotor axle 45, the first radial bearing ring 47, the axial bearing plate 49, the permanent magnet rotor 51, the second radial bearing ring 53 and the bearing bushing 55 are so-called "wet parts" which are all immersed in the fluid to be pumped. The rotating ones of the wet parts, i.e. the impeller 12, the rotor axle 45 and the permanent magnet rotor 51 are so-called "wet-running" using the fluid to be pumped for providing lubricant films for reducing friction at two radial surfaces and one axial contact surface. The fluid to be pumped is preferably water.

The wet parts are enclosed by a pot-shaped rotor can 57 such that fluid can flow between the impeller chamber 23 and the inner volume of the rotor can 57. The rotor can 57 comprises a lower first axial end, i.e. the axial end facing the impeller 12, and an upper second axial end, i.e. the axial end facing away from the impeller 12. The first axial end is open and defines a rotor can flange 63. The second axial end is closed. The second axial end of the rotor can 57 may comprise a pot-shaped coaxial appendix with a smaller radius than the main body of the rotor can 57 as shown in the embodiment according to FIGS. 1 to 9. Alternatively, the second axial end of the rotor can 57 may be an essentially flat end of main body of the rotor can 57 as shown in the embodiment according to FIGS. 10 to 19.

In order to achieve a compact configuration of the pump unit 2, the rotor can flange 63 is relatively small compared to the prior art, I. e. not much larger in diameter than the impeller 12 and fitting into the circular opening 35 of the pump housing 11. However, such a compact configuration comes with a challenge to precisely coaxially align the rotor axis with respect to the neck ring 29 of the pump housing 11. The coaxial alignment may be needed radially, axially and/or angularly. Preferred embodiments of the pump assembly disclosed herein provide for a radial, an axial and/or angular alignment of the rotor axis R, i.e. centering the rotor axis R with respect to the neck ring 29 of the pump housing 11.

In order to center the rotor axis R with respect to the neck ring 29 of the pump housing 11, the rotor can flange 63 has a radial distance to the pump housing 11. A radial gap H around the rotor can flange 63 provides for some radial wiggle room to coaxially align the rotor can 57 with respect to the pump housing 11. The rotor can 57 is centered by means of the bearing retainer 41 instead of the pump housing 11. Therefore, the rotor can 57 comprises a radial inner centering surface 65 being centered by radially abutting against a radial outer centering surface 67 of the bearing retainer 41. The bearing retainer 41 itself is centered by the bearing retainer flange 43 comprising a radial outer bearing retainer surface 69 radially abutting against a first radial inner reference surface 71 of the pump housing 11.

The radial outer bearing retainer surface 69 comprises at least three radial projections 70 radially abutting against the first radial inner reference surface 71 of the pump housing 11 and centering the bearing retainer 41 with respect to the first radial inner reference surface 71 of the pump housing 11. Similarly, the radial inner centering surface 65 of the rotor can 57 and/or the radial outer centering surface 67 of the bearing retainer 41 may have at least three radial projections 72 for centering the rotor can 57 with respect to the bearing retainer 41. In the example shown (best visible in FIG. 15), the radial outer centering surface 67 of the bearing retainer 41 comprises the radial projections 72, which project radially outward to contact the radial inner centering surface 65 of the rotor can 57. In case of radial projections at the radial inner centering surface 65 of the rotor can 57, the radial projections would project radially inward to contact the radial outer centering surface 67 of the bearing retainer 41.

As can be seen in FIGS. 3, 11, 13 and 14, the rotor can flange 63 forms a circumferential U-shaped groove 73 with a radial inner section 75 and a radial outer section 77, wherein the radial inner section 75 forms the radial inner centering surface 65 of the rotor can 57. Thereby, the rotor can flange 63 is stiffened and stabilized. The rotor can flange 63 further comprises an annular stop surface 79 facing away from the impeller 12. This annular stop surface 79 defines an exact positioning of the rotor can 57 in axial direction. The annular stop surface 79 may be slightly conical, wherein the radially outward end 81 of the annular stop surface 79 is located further away from the impeller 12 than the radially inward end 83 of the annular stop surface 79. The rotor can flange 63 may thus deform resiliently for an axial movement to resiliently withstand pressure shocks. A sealing ring 84 (only visible in the embodiment shown in FIGS. 11, 13 and 14), here in form of an O-ring with essentially circular cross-section, is arranged between the bearing retainer flange 43 and the rotor can flange 63. It seals a radial distance between the radial outer section 77 of the rotor can flange 63 and the first radial inner reference surface 71 of the pump housing 11.

As can be seen best in FIG. 14, the annular stop surface 79 abuts axially from below against a locking ring 85 being secured in a circumferential groove 87 of the pump housing 11. When the pump assembly is being assembled (see FIG. 13), the locking ring 85 may be placed into the groove 87 after the rotor can flange 63 has been placed into position within the pump housing 11. The rotor can 57 is thus secured against an upward movement out of the pump housing 11. The rotor can flange 63 comprises an annular contact surface 89 facing towards the impeller 12 and the bearing retainer flange 43 comprises an annular biasing surface 91 facing away from the impeller 12, wherein the bearing retainer 41 is resiliently spring-loaded for biasing the annular biasing surface 91 of the bearing retainer flange 43 against the annular contact surface 89 of the rotor can flange 63. The rotor can 57 is thus pressed upward against the locking ring 85 by means of the bearing retainer 41.

The bearing retainer flange 43 comprises a conical bearing retainer flange section 93, wherein a radially outward end 94 of the bearing retainer flange section 93, i.e. the radial outer bearing retainer surface 69, is located axially closer to the impeller 12 than a radially inward end 95 of the bearing retainer flange section 93. The radially most outward section of the bearing retainer flange section 93 rests on the axial annular stop surface 39 of the pump housing 11. The annular biasing surface 91 is formed by an upper radially inward portion of the conical bearing retainer flange section 93. The annular biasing surface 91 comprises n≥3 axial projections 94 towards the rotor can flange 63, wherein the axial projections 94 may be circumferentially distributed in an n-fold symmetry on the upper radially inward portion of the conical bearing retainer flange section 93. Preferably, the annular biasing surface 91 comprises n=4 dot-shaped projections 94. The projections 94 serve as well-defined points of axial contact between the rotor can flange 63 and the bearing retainer flange 43.

Figure 4:
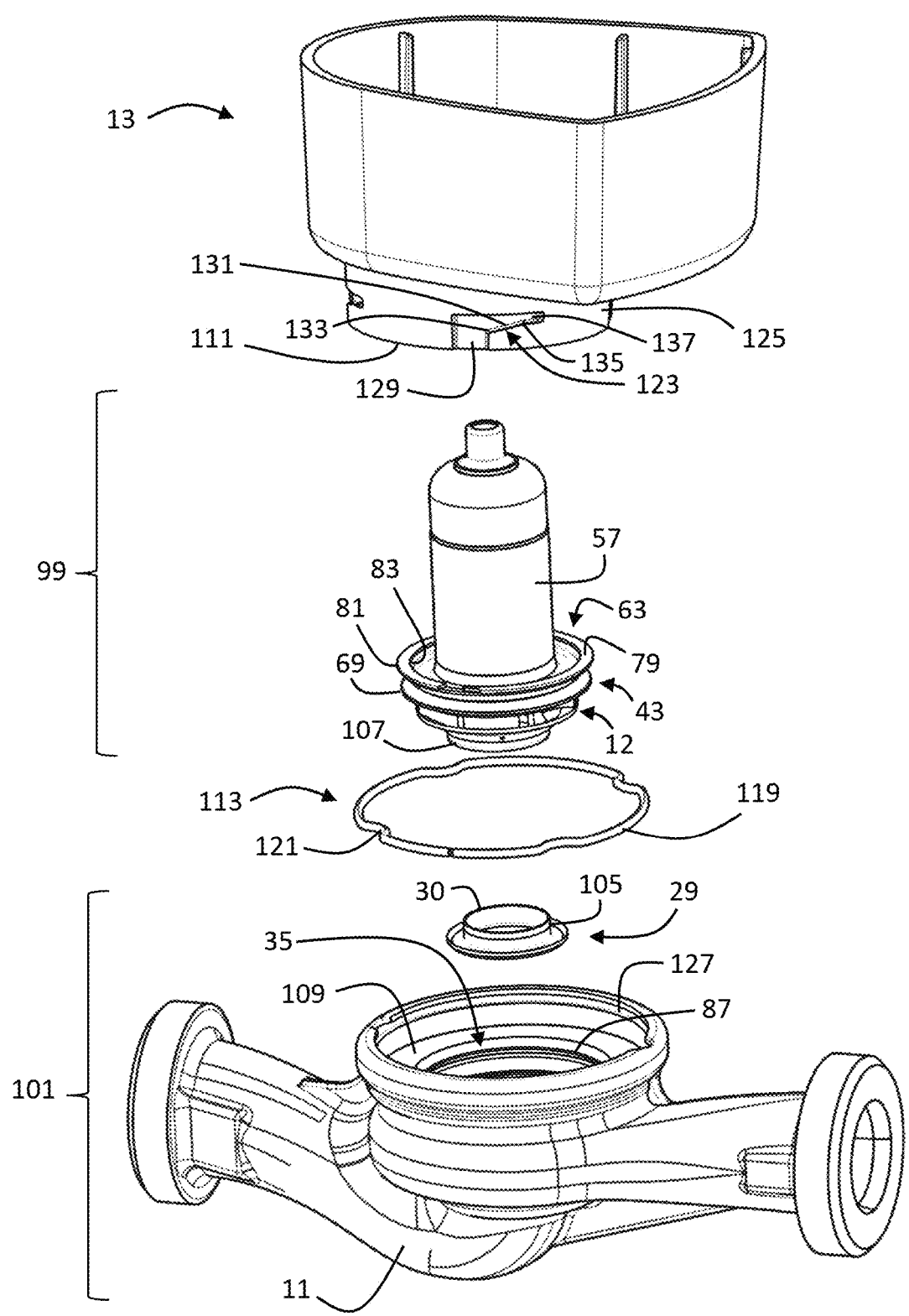
FIG. 4 is a partly exploded view of an example of a pump assembly disclosed herein.
Figure 5:
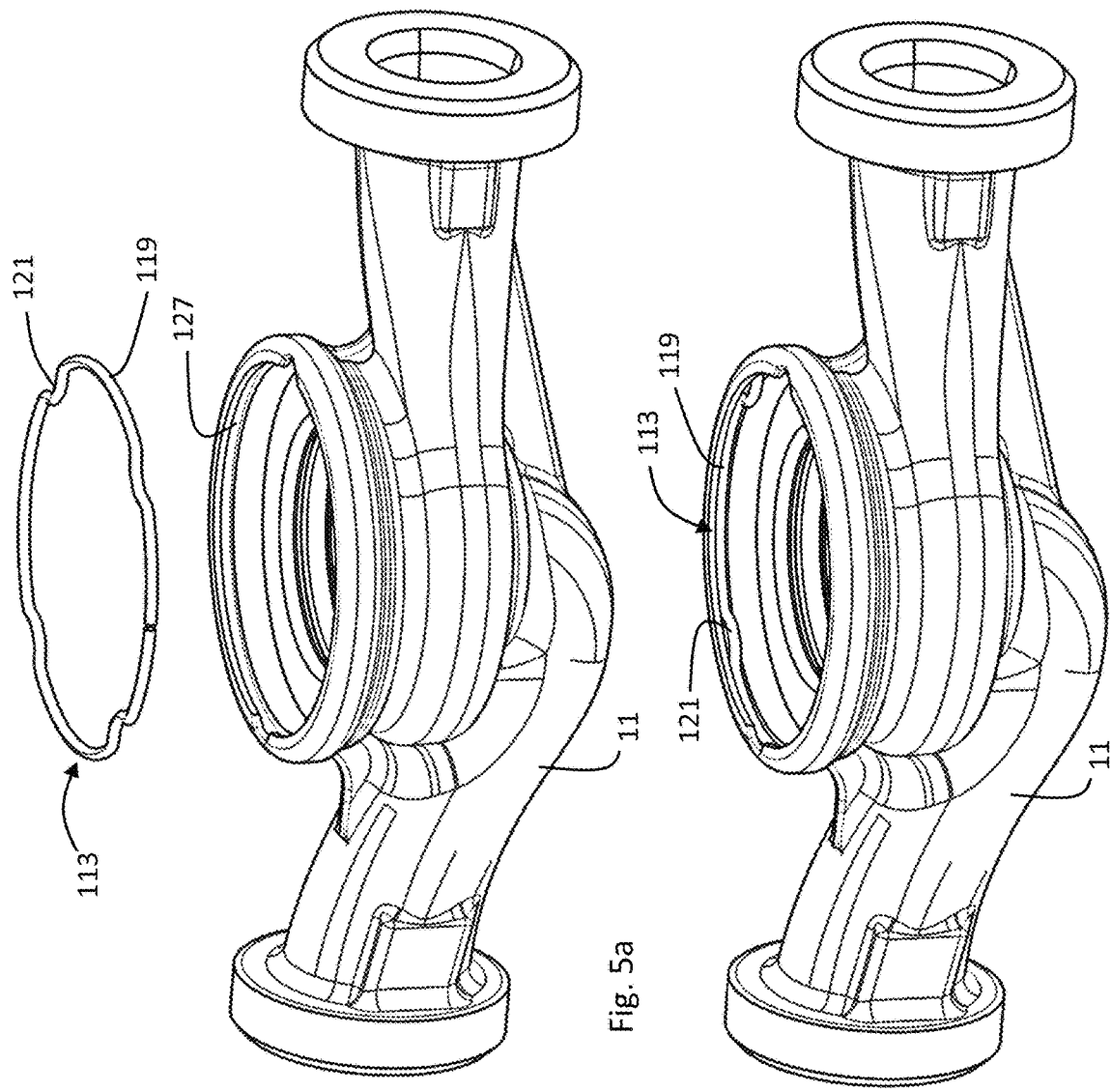
FIG. 5a is a perspective exploded view of a pump housing plus bayonet ring according to an example of a pump assembly disclosed herein.
FIG. 5b is a perspective view of a pump housing plus bayonet ring according to an example of a pump assembly disclosed herein.
Figure 6:
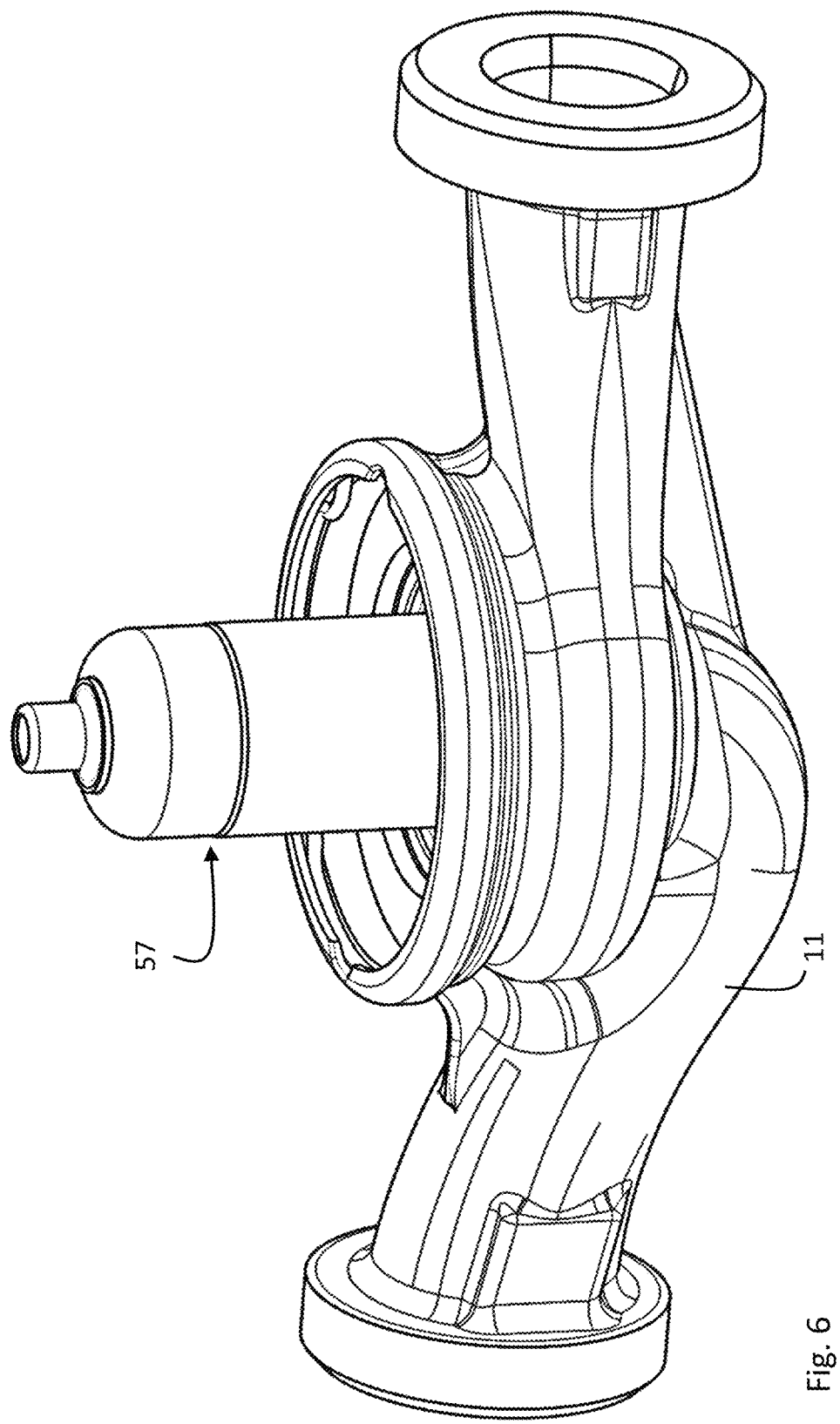
FIG. 6 is a perspective view of a pump housing plus bayonet ring and rotor can according to an example of a pump assembly disclosed herein.
Figure 7:
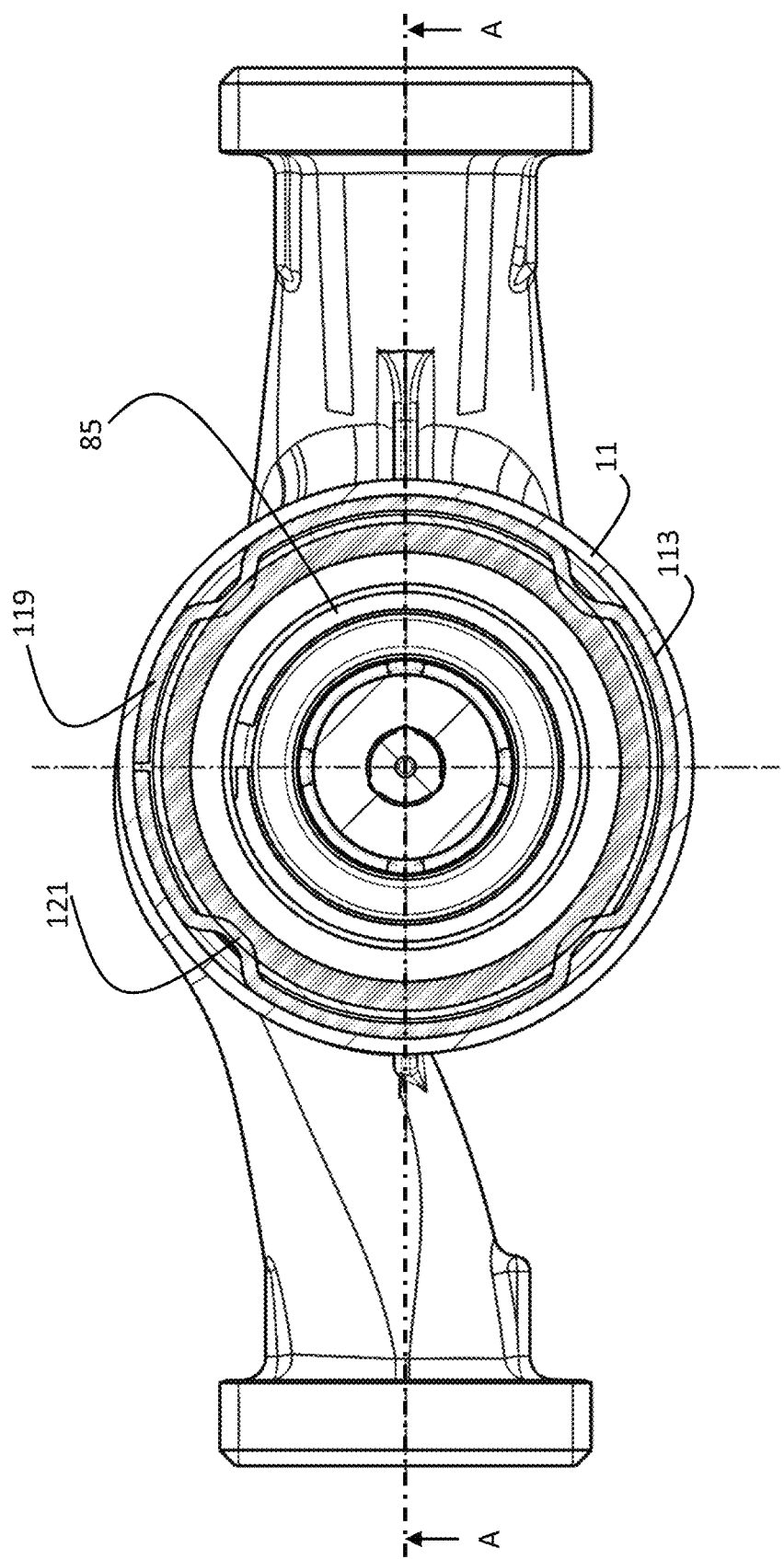
FIG. 7 is a top view of a pump housing with an inserted bayonet ring, rotor can and a locking ring according to an example of a pump assembly disclosed herein.
Figure 13:
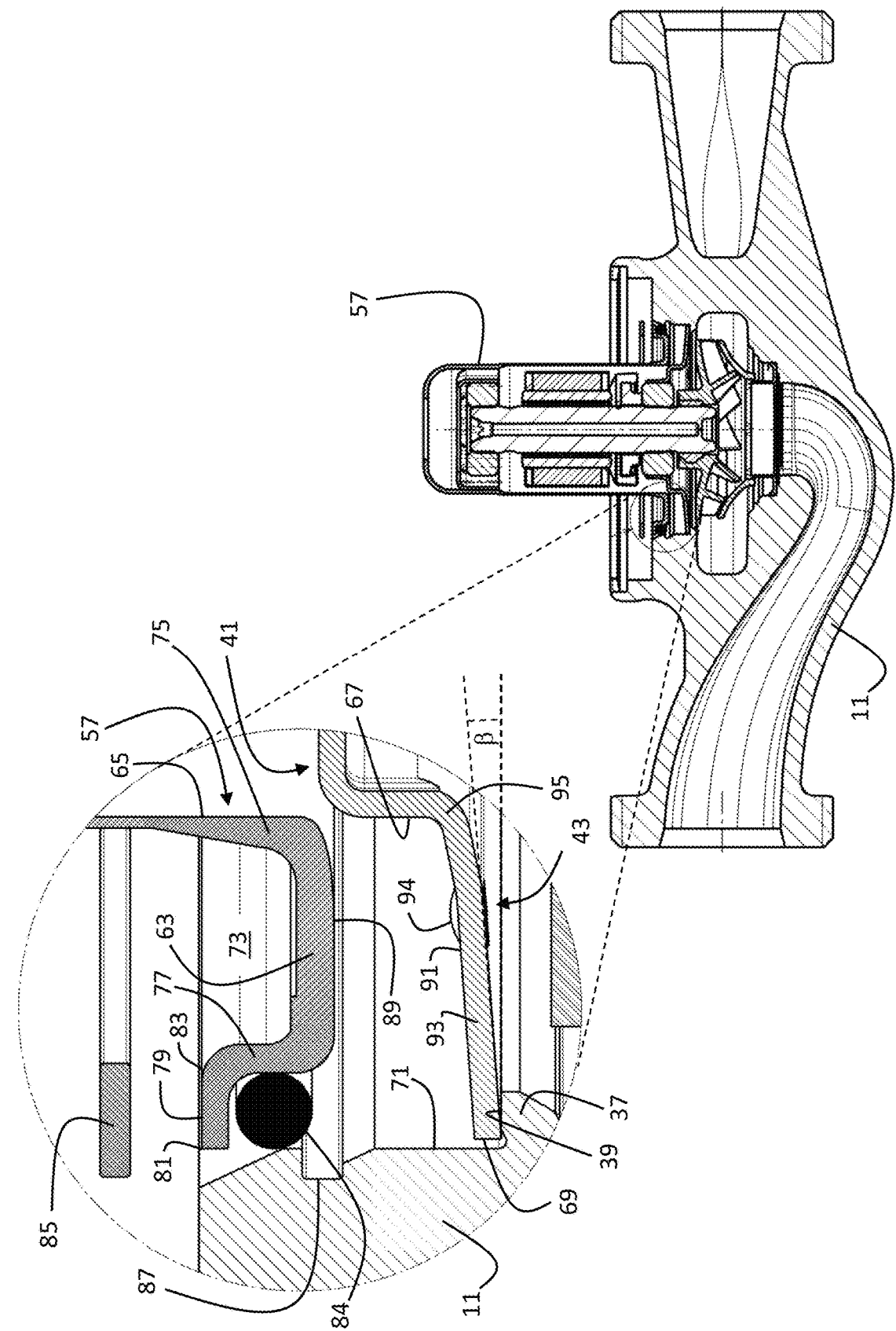
FIG. 13 is a longitudinal cut view with a detailed view of a pump housing with an installed bearing retainer and, prior to their installation, a rotor can and a locking ring according to an example of a pump assembly disclosed herein.
Figure 14:
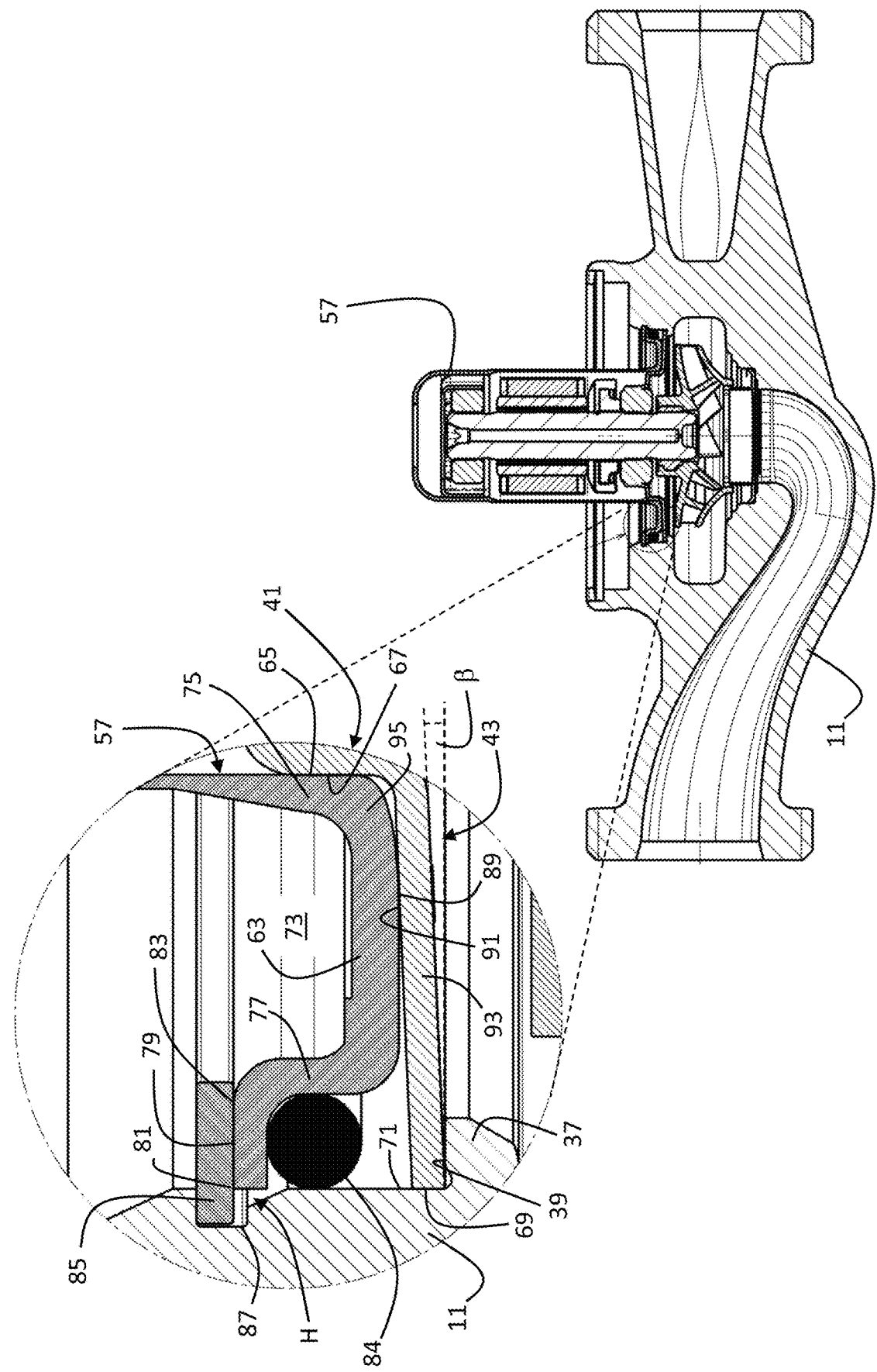
FIG. 14 is a longitudinal cut view with a detailed view of a pump housing with an installed bearing retainer and, after their installation, a rotor can and a locking ring according to an example of a pump assembly disclosed herein.

FIG. 13 shows a situation during assembly of the pump assembly 1 before the rotor can 57 is secured in position by means of the locking ring 85. FIG. 14 shows a situation after the rotor can 57 is secured in position by means of the locking ring 85. During assembly of the pump assembly 1, the bearing retainer 41 is placed into the pump housing 11 to rest on the axial annular stop surface 39 of the pump housing 11. The rotor can 57 is then pressed downwards with its lower annular contact surface 89 onto the axial protrusions 94 of the upper annular biasing surface 91 of the bearing retainer flange 43 to resiliently deform the conical bearing retainer flange section 93. The locking ring 85 is placed into the groove 87 to secure the rotor can 57 axially while the rotor can 57 is held pressed down against the bearing retainer flange 43. Thus, the bearing retainer 41 is resiliently spring-loaded to bias the rotor can 57 upward against the locking ring 85. The impeller 12, the rotor axle 45, the rotor 51, the bearings 47, 53, the bearing retainer 41 and the rotor can 57 are placed into the pump housing 11 as a first pre-assembled unit 99 (see. FIG. 4) being secured downwards by the locking ring 85, wherein the bearing retainer 41 acts as an upwardly biasing spring. It should be noted in FIG. 13 that the bearing retainer flange 43 has initially some lateral wiggle room between the radial outer bearing retainer surface 69 and the first radial inner reference surface 71 of the pump housing 11. This facilitates the insertion of the bearing retainer 41 into the pump housing 11 during assembly. As shown in FIG. 14, the axial pressure exerted by the rotor can flange 63 onto the bearing retainer flange 43 slightly flattens the conical bearing retainer flange section 93, whereby the lateral wiggle room between the radial outer bearing retainer surface 69 and the first radial inner reference surface 71 of the pump housing 11 is closed. The radial outer bearing retainer surface 69 is radially pressed outward against the first radial inner reference surface 71 of the pump housing 11. The flattening of the bearing retainer flange 43 between a first relaxed state shown in FIG. 13 and a second spring-loaded state shown in FIG. 14 can be seen by comparing the angle $\beta$ in FIGS. 13 and 14. The angle $\beta$ may be denoted as a base angle of the conical bearing retainer flange section 93 with an apex angle $\alpha = 180° - 2\beta$. The apex angle $\alpha$ is not explicitly shown in FIGS. 13 and 14, but it can be inferred that the apex angle $\alpha$ is larger in the second spring-loaded state shown in FIG. 14 than in the first relaxed state shown in FIG. 13.

Figure 15:
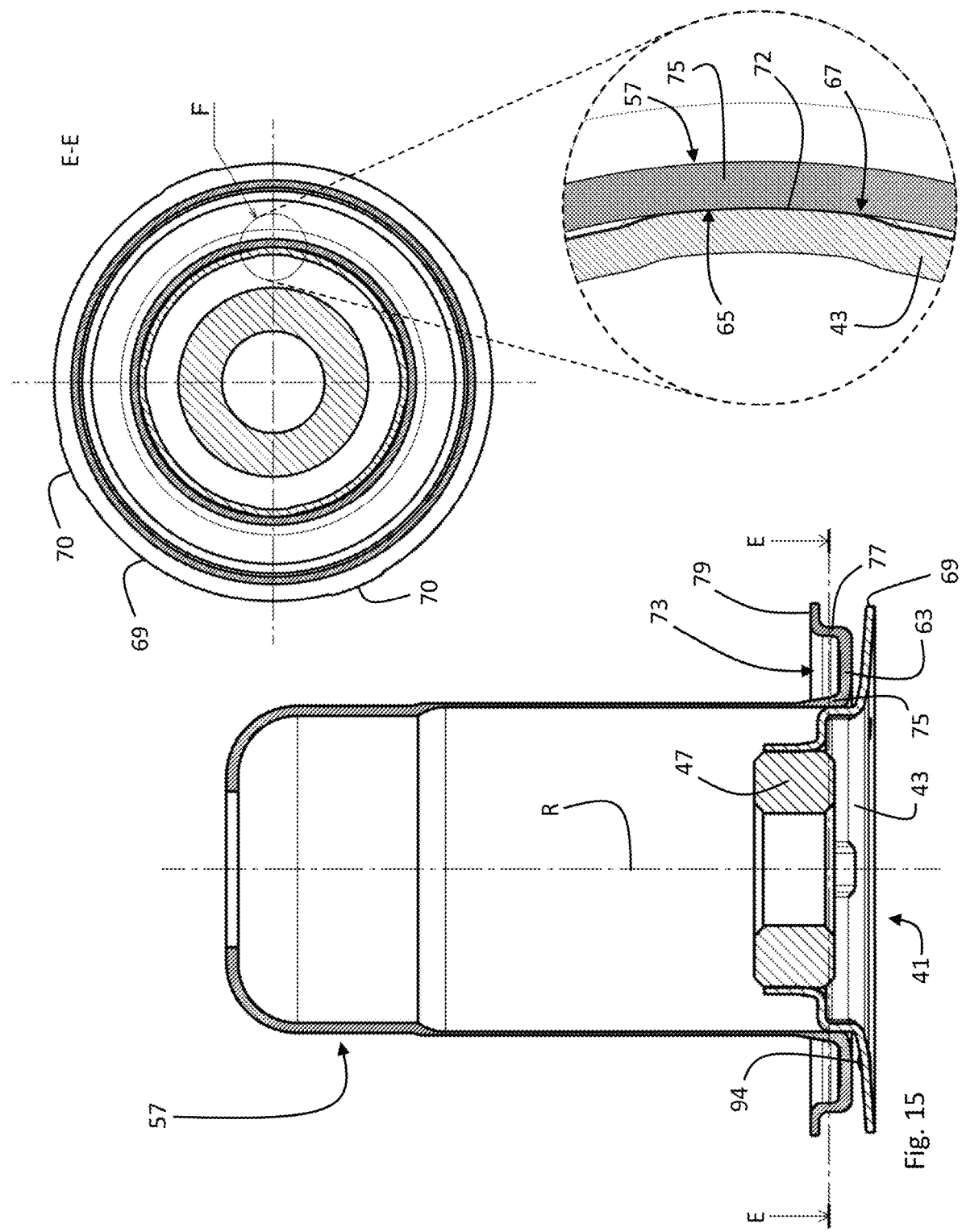
FIG. 15 is a longitudinal cut view with a top view and with a detailed top view of a bearing retainer and a rotor can according to an example of a pump assembly disclosed herein.

As shown in FIG. 15, the radial outer bearing retainer surface 69 may comprise at least three, preferably four, radial projections 70 radially abutting against the first radial inner reference surface 71 of the pump housing 11 and centering the bearing retainer 41 with respect to the first radial inner reference surface 71 of the pump housing 11. It should be noted in FIG. 14 that a radial gap H remains between the rotor can flange 63 and the pump housing 11, so that the rotor can 57 can effectively be centered by the contact between the radial inner centering surface 65 of the rotor can 57 and the radial outer centering surface 67 of the bearing retainer 41.

The neck ring 29, as shown in FIGS. 16a,b and 17a,b, is coupled to the pump housing 11 by a several tons strong press-fit so that the neck ring 29 and the pump housing 11 constitute a second pre-assembled unit 101 as opposed to the first preassembled unit 99 as shown in FIG. 4. When the pump assembly 1 is fully assembled, the impeller 12 is located axially between the bearing retainer 41 and the neck ring 29, wherein the neck ring 29 comprises the circumferential wall section 30 at least partially extending into the impeller 12. The circumferential wall section 30 comprises a radial outer surface 105 and the impeller 12 comprises a radial inner surface 107, wherein the radial outer surface 105 of the circumferential wall section 30 and the radial inner surface 107 of the impeller 12 have a radial distance defining the gap G (see FIG. 4). The indirect centering of the rotor can 57 by means of the bearing retainer 41 rather than the pump housing 11 directly reduces manufacturing tolerances and thus allows for a smaller gap G, which increases the pumping efficiency.

The gap G is minimized by an asymmetrically machined neck ring 29 as shown in FIG. 17a,b. When the neck ring 29 is coupled to the pump housing 11 by press-fitting, the neck ring 29 may be initially rotationally symmetric as shown in FIG. 16b. However, the lateral position and/or the axial alignment of the neck ring 29 may not be exact and comprises some tolerances. If the neck ring 29 is not asymmetrically machined neck ring 29 as shown in FIG. 16b after being press-fitted into the pump housing 11, the gap G must be large enough to accommodate such tolerances. As shown in FIG. 17b, the neck ring 29 is asymmetrically machined with the same tool and in the same machining processing which generates, at the pump housing 11, the first radial inner reference surface 71 and the first annular reference surface 109. As a result, as shown in FIGS. 17a,b, the circumferential wall section 30 of the neck ring 29 may get a machined cylindrical radial outer surface 105 that is exactly coaxially aligned with the first radial inner reference surface 71 and a first annular reference surface 109, and thus with the rotor axis R. After machining, the radial outer surface 105 of the circumferential wall section 30 of the neck ring 29 is eccentric with respect to a radial inner surface 110 of the circumferential wall section 30. In the detail view of FIG. 17a, a milling edge 112 extending along at least a portion of the circumference of the circumferential wall section 30 of the neck ring 29 is visible on the left-hand side, where more material was milled away from the circumferential wall section 30 of the neck ring 29 than on the right-hand side. Thereby, the radial outer surface 105 is better aligned with the rotor axis (R) so that the gap G can be configured smaller, which increases the pumping efficiency. It should be noted that the machined asymmetry of the circumferential wall section 30 of the neck ring 29 may be in the range of tens of microns or even less. In an alternative embodiment, the impeller 12 may at least partially extend into the circumferential wall section 30 of the neck ring 29, so that it is the radial inner surface 110 of the circumferential wall section 30 which is preferably eccentrically machined with respect to the radial outer surface 105 of the circumferential wall section 30 in order to reduce the gap G.

Figure 11:
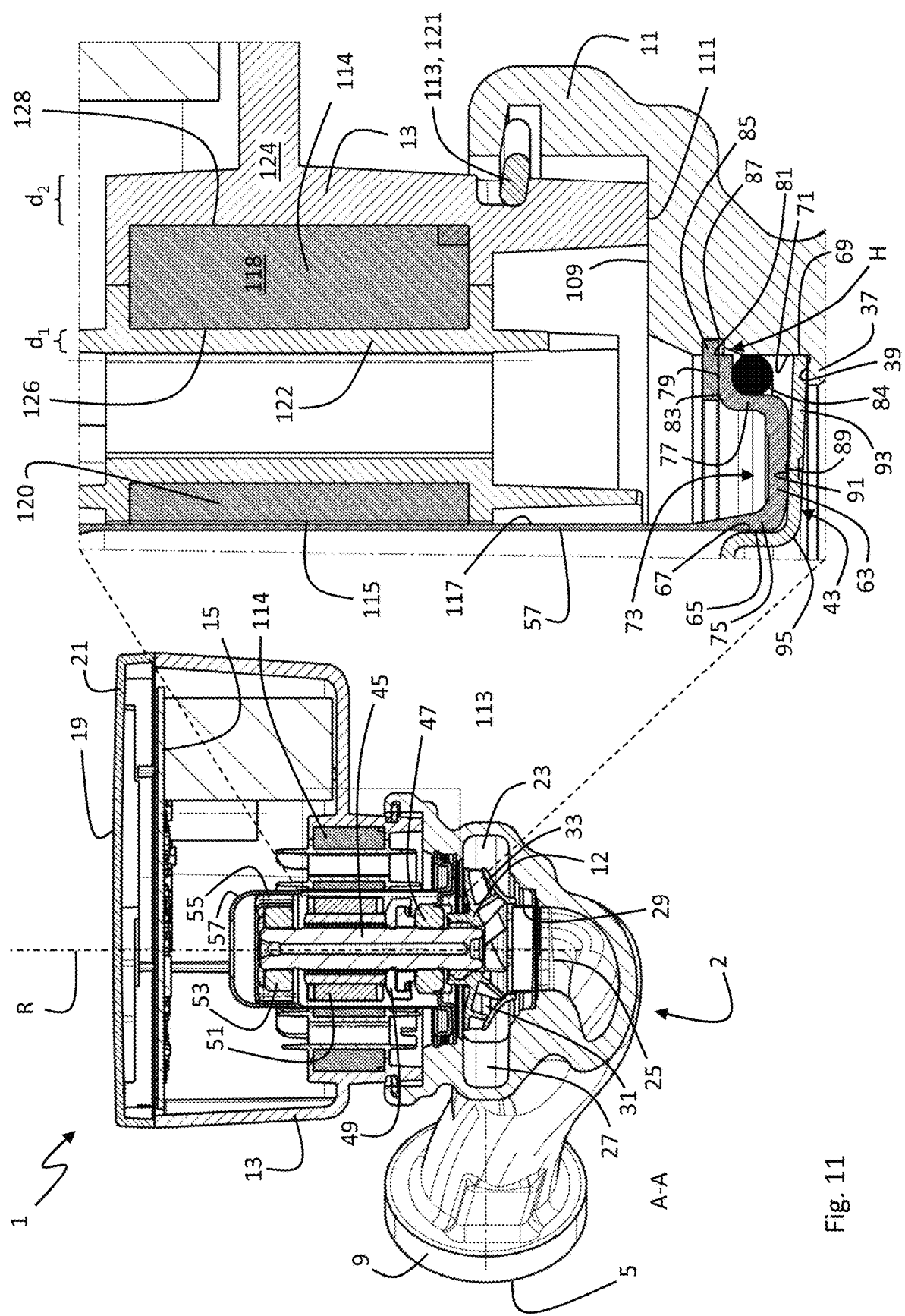
FIG. 11 is a longitudinal cut view with a detailed view along cut A-A as outlined in FIG. 10 of an example of a pump assembly disclosed herein.

The stator housing 13 may be used to angularly align the rotor axis R with respect to the pump housing 11 as shown in FIG. 11. In order to achieve this, the pump housing 11 has a machined first annular reference surface 109 facing away from the impeller 12 and the stator housing 13 has a second annular reference surface 111 facing towards the impeller 12, wherein the second annular reference surface 111 rests on the first annular reference surface 109, biased downwards my means of a bayonet ring 113. Thus, the angular orientation of the stator housing 13 with respect to the pump housing 11 is well-defined. As explained above, the first annular reference surface 109 is machined with the same tool and in the same machining processing which generates the first radial inner reference surface 71 and the outer surface 105 of the neck ring 29.

The stator 17, as shown in FIGS. 18a,b, comprises windings (not shown) wound around a stator core 114, for instance essentially comprised of a stack of ferrite or iron laminates, wherein the stator core 114 is formed as a stator ring 118 with radially inwardly projecting stator teeth 120. For the stator housing 13 to align the rotor can 57 angularly, as shown in FIG. 11, the stator teeth 120 of the stator 17 in the stator housing 13 define a second radial inner reference surface 115 for a heat-conductive contact with the rotor can 57. Correspondingly, the rotor can 57 comprises a radial outer alignment surface 117 abutting radially against the second radial inner reference surface 115. Thereby, the rotor can 57 is angularly aligned essentially perpendicular to the first annular reference surface 109 of the pump housing 11. It should be noted in FIG. 11 that the stator housing 13 has some lateral wiggle room in the pump housing 11 so that the rotor can 57 is able to center the stator housing 57 while the stator housing 13 keeps the rotor axis R essentially perpendicular to the first annular reference surface 109.

The second annular reference surface 111 of the stator housing 13 is defined by injection overmolding a surface portion of the stator core 114, wherein an injection mandrel contacts the second radial inner reference surface 115 and holds the stator core 114 in a well-defined position during overmolding. Thereby, the second annular reference surface 111 of the stator housing 13 is essentially perpendicular to the second radial inner reference surface 115 with minimal manufacturing tolerances. As shown in FIGS. 18a, b, the stator 17 comprises a first material 122 as an electrically insulating layer between the stator windings and the stator core 114. The first material 122 effectively covers a first surface portion of the stator core 114 that serves as a bobbin former for the stator windings to be spooled on. The layer of the first material 122 is preferably as thin as possible to allow for good heat-dissipation between the stator windings and the stator core 114 and thick enough to be sufficiently electrically insulating. As high thermal conductivity is mostly accompanied by low dielectric strength, the heat dissipation is effectively maximized by overmolding the first surface portion of the stator core 114 with a thin layer of the first material 122 having a high dielectric strength and/or a high comparative tracking index (CTI), for instance above 175. Irrespective of whether the pump assembly 1 is used as a medical equipment or not, the first material 122 may belong to the material group Ma according to the International Electronic Commission Standard IEC 60601-1:2005 with a CTI in the range of 175 to 400. The first material 122 may be a moldable plastic such as a polyamide (PA), a polyethylene terephthalate (PET), or a liquid crystal polymer (LCP). The first material 122 may further form bobbin webs 130 projecting axially from both axial ends of the stator core 114 to keep the windings laterally in place (see FIGS. 18a, b).

It should be noted that the overmolding of the first surface portion of the stator core 114 with the first material 122 is performed in a first overmolding step, at a relatively high temperature of the stator core 114 for decreasing the viscosity of the first material 122 and thereby achieving a comprehensive thin insulating coating layer. After that first overmolding step, at a lower temperature of the stator core 114, a second surface portion of the stator core 114 is overmolded in a separate second overmolding step with a second material 124 for forming walls of the stator housing 13. Thereby, the risk of cracking of the second material 124 is reduced, because the thermal expansion/contraction of the stator core 114 during and after overmolding can be better controlled. The second annular reference surface 111 of the stator housing 13 is defined in the second overmolding step, wherein an injection mandrel contacts the second radial inner reference surface 115 defined by the stator teeth 120 and holds the stator core 114 in a well-defined position during injection overmolding. The second material 124 fulfils different requirements than the first material 122 and may have different physical and/or chemical properties. For instance, the second material 124 may have particularly low flammability, which is less of an issue for the first material 122, which may thus have a higher flammability than the second material 124. The second material 124 may be classified with the highest flame-retarding rating 5VA according to the UL 94 Standard for Safety of Flammability of Plastic Materials. The second material 124 may be a moldable plastic such as a polyamide (PA), a polyphenylene sulphide (PPS), or a polyether ether ketone (PEEK). The second material 124 may comprise a certain glass fibre content, for instance 10% to 50%, preferably about 30%, depending on the requirements.

A radially inner surface 126 of the stator ring 118 forms part of the first surface portion of the stator core 114 that is coated with the first material 122 having a first thickness $d_1$. A radially outer surface 128 of the stator ring 118 forms part of the second surface portion of the stator core 114 that is coated with the second material 124 having a second thickness $d_2$. In order to achieve a thin insulation coating made of the first material 122 and stable integrity of the walls of the stator housing 13 made of the second material 124, the first thickness $d_1$ is lower than the second thickness $d_2$. The different thicknesses $d_1$, $d_2$ may be best seen in FIG. 11. In case the thicknesses vary, e.g. in axial direction as shown for the second thickness $d_2$ in FIG. 11, the minimal second thickness $d_2$ is higher than the minimal first thickness $d_1$. Preferably, the second thickness $d_2$ is at least 2 mm.

For providing a good leverage to the stator housing 13 to align the rotor can 57 angularly, the pump housing 11 is configured such that the first annular reference surface 109 is located radially more outward than the first radial inner reference surface 71 and/or the first annular reference surface 109 is located axially further away from the impeller 12 than the first radial inner reference surface 71.

Likewise, for having a good leverage to align the rotor can 57 angularly, the stator housing 13 is configured such that the second radial inner reference surface 115 is located radially more inward than the second annular reference surface 111 and/or the second radial inner reference surface 115 is located axially further away from the impeller 12 than the second annular reference surface 111.

Figure 12:
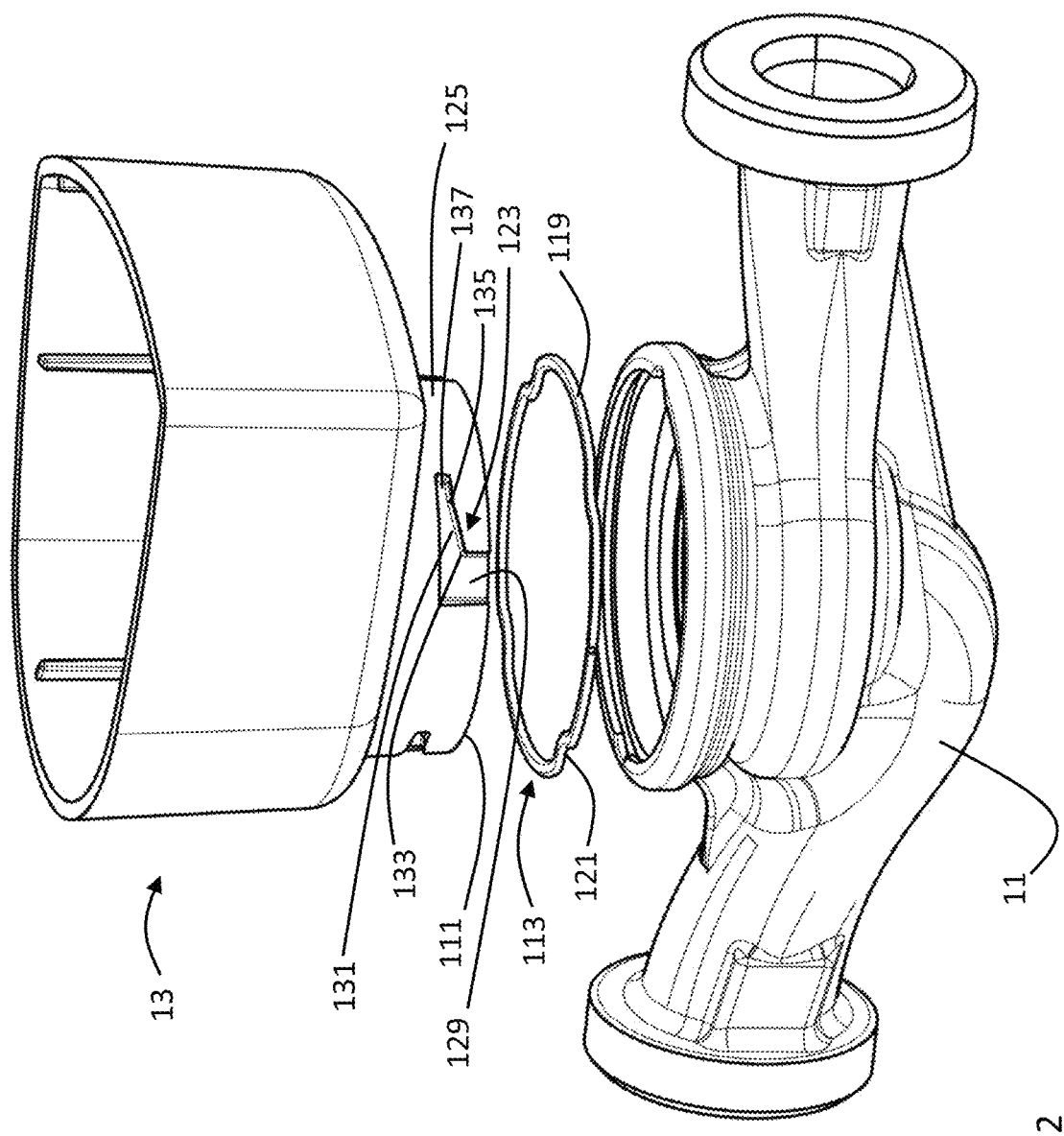
FIG. 12 is a perspective view of a pump housing plus bayonet ring and stator housing according to an example of a pump assembly disclosed herein.

The embodiments of the pump assembly 1 shown in FIGS. 1 to 19 have a very compact bayonet-like mount of the stator housing 13 to the pump housing 11 (see in particular FIGS. 4 and 12). As part of the bayonet-like mount, the bayonet ring 113 secures the stator housing 13 to the pump housing 11, wherein the bayonet ring 113 is resiliently spring-loaded for axially biasing the stator housing 13 downwards against the pump housing 11 towards the impeller 12. The second annular reference surface 111 of the stator housing 13 is thus pressed downwards onto the first annular reference surface 109 of the pump housing 11 by means of the bayonet ring 113. The bayonet ring secures 113 the stator housing against rotation around the rotor axis R in a well-defined angular position. The bayonet ring 113 is a metal wire with circular cross-section. The bayonet ring 113 comprises circumferential first sections 119 with a first radius $R_a$ and circumferential second sections 121 with a second radius wherein the second radius is smaller than the first radius $R_a$, i.e. $R_i < R_a$. The second sections 121 may be formed as radially inward projections cooperating with bayonet grooves 123 in a radially outer surface 125 of the stator housing 13. The first sections 119 of the bayonet ring 113 are secured in a circumferential groove 127 of the pump housing 11. The bayonet grooves 123 in the stator housing 13 may comprise a first "vertical" section 129 through which the second sections 121 of the bayonet ring 113 pass when the stator housing 13 is placed downwards onto the first annular reference surface 109 of the pump housing 11. The bayonet grooves 123 in the stator housing 13 may comprise a second "upwardly sloped" circumferential section 131 with a first end 133 at the first "vertical" section 129 and a second end 135 circumferentially distanced from the first end 133, wherein the first end 133 of the second section 131 is located closer to the second annular reference surface 111 of the stator housing 13 than the second end 135 of the second section 131. Upon manual rotation of the stator housing 13 by a pre-defined angle for the second sections 121 of the bayonet ring 113 to be guided along the second sections 131 of the bayonet grooves 123 from the first end 133 to the second end 135, the second sections 121 of the bayonet ring 113 are pushed upward by the slope while the first sections 119 of the bayonet ring 113 remain secured in the pump housing 11. Thereby, the bayonet ring 113 resiliently twists between the first sections 119 and the second sections 121. The second sections 121 of the bayonet ring 113 may click into a horizontal or "downwardly sloped" end section 137 at the second end 135 of the second section 131 of the grooves 123. The resilient twist of the bayonet ring 113 biases the second annular reference surface 111 of the stator housing 13 downward onto the first annular reference surface 109 of the pump housing 11.

FIGS. 19a-c show the lid or cap 21 of the stator housing 13 in different views. The cap 21 comprises two materials, a first electrically insulating material 139 at the outer side of the cap 21 and a heat-conductive second material 141 at the inner side of the cap 21. The first material 139 of the cap 21 may be the same as the second material 124 of the stator 17. The heat-conductive material 141 may comprise a metal or a plastic with heat-conductive additives such as graphite carbon fibers and/or ceramics like boron nitride. As the heat-conductive material 141 is usually less suitable for electric insulation, the first heat-conductive material 141 is only at the inside of the cap 21 and not at the outside. The inner side of the first material 139 may be at least partially overmolded with the heat-conductive material 141. The heat-conductive material 141 is useful to dissipate heat from the PCB 15 which extends in a plane essentially perpendicular to the rotor axis R close to the inner side of the cap 21. It is particularly advantageous that the cap 21 comprises a front face 19 that extends essentially parallel to the PCB 15, i.e. essentially perpendicular to the rotor axis R, and a radially outer wall 143 extending essentially parallel to the rotor axis R. Thereby, the heat-conductive material 141 can not only extend essentially parallel to the front face 19 at the inner side of the cap 21, but also essentially parallel to the radially outer wall 143 at the inner side of the cap 21. This has the advantage that the heat from the PCB 15 is effectively dissipated when the pump assembly 1 is installed in a horizontal as well as in a vertical rotor axis orientation. This is, because the heat-conductive material 141 is most efficient when a convection hot air stream is able to flow along the outer side of the first material 139 to cool down. As the convection hot air stream is mainly vertical, it is advantageous to have the heat-conductive material 141 close to the PCB 15 extending in a vertical direction irrespective of the installation orientation of the rotor axis R of the pump assembly 1. The surface of the heat-conductive material 141 that is facing the PCB 15 is terraced corresponding to the layout of the PCB, so that a direct contact or only a minimal gap between the electronic components on the PCB 15 and the heat-conductive material 141 is achieved over most of the area of the PCB 15 to facilitate a most efficient heat transfer from the components of the PCB 15 to the heat-conductive material 141, preferably indirectly conveyed by a heat-conductive paste arranged between the heat-conductive material 141 and the electronic components on the PCB 15.

FIG. 19c indicates by dashes in the second material 141 that the second material 141 is not fully homogeneous, but has an inner structure defining a certain spatial orientation of the second material 141. The spatial orientation of the inner structure of the second material 141 basically follows a flow path that the second material 141 took during the overmolding of the inner side of the cap 21. Therefore, the second material 141 comprises at least one first area 145, where the spatial orientation is predominantly parallel to the rotor axis (R), and at least one second area 147, where the spatial orientation is predominantly perpendicular to the rotor axis (R). The first area(s) 145 mark the area(s) at or around injection point(s) of the second material 141 during overmolding. The second area(s) 147 mark the area(s) where the second material 141 flows along the inner side of the front face 19. It was found that the spatial orientation of the inner structure of the second material 141 has a significant influence on the heat-conducting properties. Heat conduction along the spatial orientation of the inner structure of the second material 141 is better than perpendicular to it. Therefore, the first area 145 of the second material 141 has a first direction 149 of predominant heat-conduction perpendicular to the front face 19, whereas the second area 147 of the second material 141 has a second direction 151 of predominant heat-conduction parallel to the front face 19 or the radially outer wall 143 of the cap 21. The lateral location of the injection point(s) of the second material 141 during overmolding may thus be wisely chosen to define the first area(s) 145, where the hottest electronic components are located on the PCB 15. This facilitates the heat dissipation from the components on the PCB 15 into the second material 141, which spreads the heat laterally via the second area(s) 147. The first material 139 may act as a heat sink that is cooled by an ambient convection air stream along the front face 19 and/or the radially outer wall 143 of the cap 21.

Where, in the foregoing description, integers or elements are mentioned which have known, obvious or foreseeable equivalents, then such equivalents are herein incorporated as if individually set forth. Reference should be made to the claims for determining the true scope of the present disclosure, which should be construed so as to encompass any such equivalents. It will also be appreciated by the reader that integers or features of the disclosure that are described as optional, preferable, advantageous, convenient or the like are optional and do not limit the scope of the independent claims.

The above embodiments are to be understood as illustrative examples of the disclosure. It is to be understood that any feature described in relation to any one embodiment may be used alone, or in combination with other features described, and may also be used in combination with one or more features of any other of the embodiments, or any combination of any other of the embodiments. While at least one exemplary embodiment has been shown and described, it should be understood that other modifications, substitutions and alternatives are apparent to one of ordinary skill in the art and may be changed without departing from the scope of the subject matter described herein, and this application is intended to cover any adaptations or variations of the specific embodiments discussed herein.

In addition, "comprising" does not exclude other elements or steps, and "a" or "one" does not exclude a plural number. Furthermore, characteristics or steps which have been described with reference to one of the above exemplary embodiments may also be used in combination with other characteristics or steps of other exemplary embodiments described above. Method steps may be applied in any order or in parallel or may constitute a part or a more detailed version of another method step. It should be understood that there should be embodied within the scope of the patent warranted hereon all such modifications as reasonably and properly come within the scope of the contribution to the art. Such modifications, substitutions and alternatives can be made without departing from the spirit and scope of the disclosure, which should be determined from the appended claims and their legal equivalents.

While specific embodiments of the invention have been shown and described in detail to illustrate the application of the principles of the invention, it will be understood that the invention may be embodied otherwise without departing from such principles.

LIST OF REFERENCE DESIGNATIONS 1 pump assembly
2 pump unit
3 input port
5 output port
7 connector flange
9 connector flange
11 pump housing
12 impeller
13 stator and/or electronics housing
15 printed circuit board (PCB)
17 stator
19 front face of the cap of the stator housing
21 cap of the stator housing
23 impeller chamber
25 concentric bottom entry
27 tangential exit
29 neck ring
31 inner spiral vanes
33 impeller plate
35 circular opening
37 inward projection
39 axial annular stop surface of the pump housing
41 bearing retainer
43 bearing retainer flange
45 rotor axle
47 first radial bearing ring
49 axial bearing plate
51 rotor
53 second radial bearing ring
55 bearing bushing
57 rotor can
63 rotor can flange
65 radial inner centering surface
67 radial outer centering surface
69 radial outer bearing retainer surface
70 radial projections of the radial outer bearing retainer surface
71 first radial inner reference surface
72 radial projections of the radial outer centering surface
73 circumferential groove of the rotor can flange
75 radial inner section of the rotor can flange
77 radial outer section of the rotor can flange
79 annular stop surface of the rotor can flange
81 radially outward end of the annular stop surface of the rotor can flange
83 radially inward end of the annular stop surface of the rotor can flange
84 sealing ring
85 locking ring
87 circumferential groove of the pump housing 89 annular contact surface of the rotor can flange
91 annular biasing surface of the bearing retainer flange
93 bearing retainer flange section
94 axial projections
95 radially inward end of the bearing retainer flange section
99 first pre-assembled unit
101 second pre-assembled unit
105 radial outer surface
107 radial inner surface
109 first annular reference surface
110 radial inner surface
111 second annular reference surface
112 milling edge
113 bayonet ring
114 stator core
115 second radial inner reference surface
117 radial outer alignment surface
118 stator ring
119 circumferential first sections of the bayonet ring
120 stator teeth
121 circumferential second sections of the bayonet ring
122 first material of the stator
123 bayonet grooves
124 second material of the stator
125 radially outer surface of the stator housing
126 radially inner surface of the stator ring
127 circumferential groove of the pump housing
128 radially outer surface of the stator ring
129 first section of a bayonet groove
130 bobbin webs
131 second section of a bayonet groove
133 first end of the second section of a bayonet groove
135 second end of the second section of a bayonet groove
137 end section of a bayonet groove
139 first material of the cap of the stator housing
141 second material of the cap of the stator housing
143 radially outer wall of the cap of the stator housing
145 first area of the first material of the cap of the stator housing
147 second area of the first material of the cap of the stator housing
149 first direction of predominant heat dissipation
151 second direction of predominant heat dissipation
R rotor axis
H radial gap of the rotor can
G radial gap of the neck ring
α apex angle of conical bearing retainer flange section $$\beta = \frac{180° - \alpha}{2}$$

What is claimed is:

1. A pump assembly comprising:
a rotor axle extending along a rotor axis;
an impeller fixed to the rotor axle;
a pump housing accommodating the impeller;
a drive motor comprising a stator and a rotor, wherein the rotor is fixed to the rotor axle for driving the impeller;
a rotor can accommodating the rotor, wherein the rotor can comprises a rotor can flange; and
an electronics housing comprising a cap comprising a first material forming a front face of the cap and a second material, wherein the first material of the cap is at least partially overmolded with the second material at an inner side of the cap and the second material is a moldable plastic containing heat-conductive additives and the second material is more heat-conductive than the first material.

2. The pump assembly according to claim 1, wherein:
the additives comprise one or more of a graphite carbon fiber and a ceramic;
the cap comprises a radially outer wall comprising the first material;
the radially outer wall extends perpendicular to the front face; and
an inner side of the radially outer wall is at least partially overmolded with the second material.

3. The pump assembly according to claim 1, wherein the first material has a higher dielectric strength and/or a higher comparative tracking index than the second material.

4. The pump assembly according to claim 1, further comprising a PCB in the electronics housing, wherein the second material is terraced at an inner side facing towards the PCB, extending parallel to the front face, in order to establish an axial direct or indirect thermal contact between the second material and electronic components on the PCB.

5. The pump assembly according to claim 1, wherein:
the second material comprises at least one first area having a first direction of predominant heat-conduction extending perpendicular to the front face; and
the second material comprises at least one second area having a second direction of predominant heat-conduction extending parallel to the front face.

6. The pump assembly according to claim 5, wherein the at least one first area is located at or around injection points for overmolding the first material of the cap with the second material.

7. The pump assembly according to claim 5, further comprising a PCB in the electronics housing, wherein the at least one first area is axially in direct or indirect thermal contact with an electronic component on the PCB that dissipate most heat during pump operation.

8. The pump assembly according to claim 1, further comprising:
a first radial bearing ring in sliding contact with the rotor axle; and
a bearing retainer engaging the first radial bearing ring and centering the first radial bearing ring with respect to a first radial inner reference surface of the pump housing, wherein the rotor can flange has a radial distance to the pump housing and the rotor can comprises a radial inner centering surface, centered by radially abutting against a radial outer centering surface of the bearing retainer.

9. The pump assembly according to claim 8, wherein the radial inner centering surface of the rotor can and/or the radial outer centering surface of the bearing retainer have at least three radial projections.

10. The pump assembly according to claim 8, wherein the bearing retainer comprises a radial outer bearing retainer surface having at least three radial projections radially abutting against the first radial inner reference surface of the pump housing and centering the bearing retainer with respect to the first radial inner reference surface of the pump housing.

11. The pump assembly according to claim 1, wherein:
the rotor can flange forms a circumferential U-shaped groove with a radial inner section and a radial outer section; and
the radial inner section forms a radial inner centering surface of the rotor can.

12. The pump assembly according to claim 1, further comprising a bayonet ring for securing the electronics housing to the pump housing, wherein the bayonet ring is resiliently preloaded for axially biasing the electronics housing against the pump housing towards the impeller.

13. A method of manufacturing a cap of an electronics housing of a pump assembly comprising a rotor axle extending along a rotor axis, an impeller fixed to the rotor axle, a pump housing accommodating the impeller, a drive motor comprising a stator and a rotor, wherein the rotor is fixed to the rotor axle for driving the impeller, a rotor can accommodating the rotor, wherein the rotor can comprises a rotor can flange; and the electronics housing comprising the cap, the method comprising the steps of:
forming a front face of the cap from a first material; and
at least partially overmolding the first material with a second material at an inner side of the cap, wherein the second material is a moldable plastic containing heat-conductive additives and the second material is more heat-conductive than the first material.

14. The method according to claim 13, wherein the step of at least partially overmolding comprises injecting the second material at one or more areas where electronic components on a PCB extend essentially parallel to the front face are located which dissipate most heat during pump operation.

15. The method according to claim 13, wherein the first material has a higher dielectric strength and/or a higher comparative tracking index than the second material.

16. The method according to claim 13, wherein:
the additives comprise one or more of a graphite carbon fiber and a ceramic;
the cap comprises a radially outer wall comprising the first material;
the radially outer wall extends perpendicular to the front face; and
an inner side of the radially outer wall is at least partially overmolded with the second material.

17. The method according to claim 13, wherein the pump assembly further comprises a PCB in the electronics housing, wherein the second material is terraced at an inner side facing towards the PCB, extending parallel to the front face, in order to establish an axial direct or indirect thermal contact between the second material and electronic components on the PCB.

18. The method according to claim 13, wherein:
the second material comprises at least one first area having a first direction of predominant heat-conduction extending perpendicular to the front face; and
the second material comprises at least one second area having a second direction of predominant heat-conduction extending parallel to the front face.

19. The method according to claim 18, wherein the at least one first area is located at or around injection points for overmolding the first material of the cap with the second material.

20. The method according to claim 13, wherein the pump assembly further comprises:
a first radial bearing ring in sliding contact with the rotor axle; and
a bearing retainer engaging the first radial bearing ring and centering the first radial bearing ring with respect to a first radial inner reference surface of the pump housing, wherein the rotor can flange has a radial distance to the pump housing and the rotor can comprises a radial inner centering surface, centered by radially abutting against a radial outer centering surface of the bearing retainer.

\* \* \* \* \*